(12) United States Patent
Broome et al.

(10) Patent No.: US 8,947,879 B2
(45) Date of Patent: Feb. 3, 2015

(54) PORTABLE COMPUTER SERVER ENCLOSURE

(75) Inventors: John P. Broome, Silver Spring, MD (US); Thomas S. Oberlin, Leesburg, VA (US); Eduardo W. Nusser, Santiago (CL); Donald W. Kauffman, Millmont, PA (US)

(73) Assignee: Smartcube, LLC, Vienna, VA (US)

( * ) Notice: Subject to any disclaimer, the term of this patent is extended or adjusted under 35 U.S.C. 154(b) by 80 days.

(21) Appl. No.: 13/328,601

(22) Filed: Dec. 16, 2011

(65) Prior Publication Data

US 2012/0155027 A1 Jun. 21, 2012

Related U.S. Application Data

(60) Provisional application No. 61/423,809, filed on Dec. 16, 2010.

(51) Int. Cl.
*H05K 7/20* (2006.01)
*G06F 1/20* (2006.01)
*H05K 7/14* (2006.01)

(52) U.S. Cl.
CPC .......... *H05K 7/1497* (2013.01); *H05K 7/20745* (2013.01)
USPC .................. 361/696; 361/679.48; 361/679.53; 361/698; 361/699; 165/104.33; 414/141.3; 414/392; 414/660

(58) Field of Classification Search
USPC ............... 361/679.47–679.5, 679.53–679.54, 361/694–696, 698–699, 701, 704, 361/715–716; 165/104.33, 185; 414/140.3, 414/141.3, 660
See application file for complete search history.

(56) References Cited

U.S. PATENT DOCUMENTS

| | | | | |
|---|---|---|---|---|
| 3,499,554 A | * | 3/1970 | Davis et al. | 414/283 |
| 4,944,056 A | * | 7/1990 | Schroeder et al. | 5/85.1 |
| 5,688,030 A | * | 11/1997 | McAnally et al. | 312/223.2 |
| 6,305,180 B1 | * | 10/2001 | Miller et al. | 62/259.2 |
| 6,775,137 B2 | * | 8/2004 | Chu et al. | 361/696 |
| 6,924,981 B2 | * | 8/2005 | Chu et al. | 361/696 |
| 7,042,732 B2 | * | 5/2006 | Hung | 361/727 |
| 7,048,491 B2 | * | 5/2006 | Windbergs | 414/542 |
| 7,051,802 B2 | * | 5/2006 | Baer | 165/299 |

(Continued)

FOREIGN PATENT DOCUMENTS

| | | | | |
|---|---|---|---|---|
| JP | 2000270351 A | * | 9/2000 | H04Q 1/02 |
| WO | 2008/056384 | | 5/2008 | |
| WO | WO 2013159157 A1 | * | 10/2013 | A47B 47/00 |

OTHER PUBLICATIONS

International Search Report issued in PCT/US2011/065492 on Apr. 15, 2013.

(Continued)

*Primary Examiner* — Robert J Hoffberg
(74) *Attorney, Agent, or Firm* — Nixon & Vanderhye P.C.

(57) ABSTRACT

A container that holds rack mountable electronics equipment includes a plurality of rack enclosures and a corresponding plurality of enclosure cooling units. Each rack enclosure is movably mounted in the container such it can move from a position abutting a front of an enclosure cooling unit to a maintenance and access position spaced apart from the enclosure cooling unit. Each enclosure cooling unit is capable of providing varying amounts of cool air to the rack enclosure it abuts, so that the interior of each rack enclosure can be maintained at a different temperature.

20 Claims, 17 Drawing Sheets

(56) References Cited

U.S. PATENT DOCUMENTS

| | | | |
|---|---|---|---|
| 7,134,831 B2 * | 11/2006 | Risser | 414/542 |
| 7,377,398 B2 * | 5/2008 | Lichinchi | 212/175 |
| 7,397,661 B2 * | 7/2008 | Campbell et al. | 361/696 |
| 7,413,394 B2 * | 8/2008 | Risser | 414/542 |
| 7,455,103 B2 * | 11/2008 | Sato et al. | 165/299 |
| 7,477,514 B2 * | 1/2009 | Campbell et al. | 361/699 |
| 7,492,593 B2 * | 2/2009 | Campbell et al. | 361/696 |
| 7,511,960 B2 * | 3/2009 | Hillis et al. | 361/702 |
| 7,551,971 B2 * | 6/2009 | Hillis | 700/90 |
| 7,604,134 B2 * | 10/2009 | Lichinchi | 212/175 |
| 7,630,795 B2 * | 12/2009 | Campbell et al. | 700/300 |
| 7,660,121 B2 * | 2/2010 | Campbell et al. | 361/698 |
| 7,688,578 B2 * | 3/2010 | Mann et al. | 361/679.46 |
| 7,791,882 B2 * | 9/2010 | Chu et al. | 361/698 |
| 7,854,652 B2 * | 12/2010 | Yates et al. | 454/184 |
| 7,856,838 B2 * | 12/2010 | Hillis et al. | 62/259.2 |
| 8,004,839 B2 * | 8/2011 | Sato et al. | 361/696 |
| 8,047,904 B2 * | 11/2011 | Yates et al. | 454/118 |
| 8,113,009 B2 * | 2/2012 | Kuriyama et al. | 62/259.2 |
| 8,116,080 B2 * | 2/2012 | Wormsbecher et al. | 361/701 |
| 8,371,666 B2 * | 2/2013 | Wu | 312/334.28 |
| 8,387,687 B2 * | 3/2013 | Baer | 165/299 |
| 2005/0061013 A1 * | 3/2005 | Bond | 62/259.2 |
| 2006/0082263 A1 * | 4/2006 | Rimler et al. | 312/201 |
| 2008/0123288 A1 | 5/2008 | Hillis | |
| 2009/0086432 A1 * | 4/2009 | Campbell et al. | 361/696 |
| 2009/0122483 A1 * | 5/2009 | Hall | 361/688 |
| 2012/0075806 A1 * | 3/2012 | Wormsbecher et al. | 361/701 |
| 2012/0104918 A1 * | 5/2012 | Peng et al. | 312/334.27 |
| 2012/0104920 A1 * | 5/2012 | Peng et al. | 312/334.28 |
| 2012/0119632 A1 * | 5/2012 | Bousseton et al. | 312/236 |
| 2012/0200992 A1 * | 8/2012 | Schmitt et al. | 361/679.02 |
| 2013/0163185 A1 * | 6/2013 | Gilges et al. | 361/679.41 |

OTHER PUBLICATIONS

Written Opinion issued in PCT/US2011/065492 on Apr. 15, 2013.

* cited by examiner

PORTABLE COMPUTER SERVER ENCLOSURE

This application claims priority to the filing date of U.S. Provisional Application Ser. No. 61/423,809, filed Dec. 16, 2010, the contents of which is incorporated herein by reference.

BACKGROUND OF THE INVENTION

The technology relates to data warehousing facilities which include many racks of computer servers. Such data warehousing facilities are used by many companies to provide online computer services.

In a typical data warehouse facility, many racks of computer servers are located inside an environmentally controlled room. The data warehouse facility includes a power and data distribution system to provide electrical power and data connections to all the servers. Further, the data warehouse facility will typically include powerful cooling systems to ensure that the ambient temperature within the data facility is kept at a desirably low temperature.

The vast majority of rack mountable servers cool their electrical components with cooling fans. The cooling fans of most computer servers draw cooling air into the front of the server enclosure, the air passes over the electrical components within the server to cool the electrical components, and the airflow is ultimately vented from the rear of the server enclosure. When many servers are all operating in the same space, the servers produce a great deal of heated air. The data warehouse facility must remove this heat from the space in order to ensure that all the servers remain at a desirably low temperature.

Typically the environmental control systems in a data warehouse facility are designed to keep the entire interior space of the data warehouse facility at a temperature that ensures that the equipment most sensitive to overheating is provided with air at a sufficiently low temperature to prevent such overheating. However, much of the equipment located in such a facility does not require air at that same low temperature. In fact, it is often the case that much of the equipment in a data warehouse facility could operate normally if provided with air at considerably higher ambient temperatures. Nevertheless, the air is maintained at the lower temperatures to accommodate the more sensitive equipment.

Because the processing requirements of a computer services company can vary over time, it is often necessary for a company to add or remove servers from a particular data warehouse so that the number of installed servers matches the current processing requirements. Adding servers can be accomplished in various ways.

In some instances, new racks with new servers are permanently installed in a data warehouse. However, if the data processing requirements at that data warehouse later decrease, the newly installed servers and associated power and cooling distribution systems can represent unused overhead.

To address varying processing demands, attempts have been made to provide data warehousing facilities with temporarily mounted server equipment. The temporarily mounted equipment can later be removed if the processing needs at a facility decrease. Also, temporarily mounted equipment can be moved from a facility where the data processing needs have decreased to a second facility where the data processing needs have increased. Thus, temporarily mounted server systems can be moved to various facilities on an as-needed basis.

One way this is accomplished is to mount a plurality of racks of servers inside a traditional shipping container. The shipping container itself can be easily moved to a desired location where there is a need for additional data processing capabilities. The racks of servers are mounted inside standard shipping containers because existing transportation services, such as trains, trucks and ships, are already designed to handle standard shipping containers.

Whenever it is necessary to add additional data processing capability to a data warehousing facility, one simply moves a shipping container with racks of servers into the data warehousing facility. The servers are then connected to power and data lines.

Existing transportable shipping containers containing racks of servers cool the servers in one of two ways. In some instances, cooled air produced by the environmental control system in the warehouse facility is used to cool the servers. This means that the servers in a shipping container vent heated air into the ambient atmosphere in the data warehousing facility. The environmental control system in the facility must then remove the heat generated by the servers in the shipping container.

Alternatively, a shipping container may include heat exchangers that utilize cooling water from an external source to remove heat produced by the servers. In this instance, the data warehouse facility must provide a supply of cooling water.

To ensure that a data warehouse facility is capable of cooling all servers in the facility, the cooling equipment in the data warehouse must be configured to cool the total number of servers that could ultimately be located inside the warehouse. If, at any given time, the warehouse is not full of servers, there will be excess unused cooling capacity. This can result in inefficient cooling for the number of servers that are actually present. In addition, this can require the purchase, installation and maintenance of cooling equipment that is never used, because the warehouse is never scaled up to full capacity.

As noted above, in some instances, a transportable shipping container may have a fluid cooling system that is designed to help cool the servers mounted in the shipping container using an external source of cooling water. In this instance, the data warehousing facility must be capable of providing a sufficient amount of cooling fluid to cool all the servers that could possibly be located in the warehouse. If the facility is not fully populated, this too can result in unused overcapacity.

Many shipping containers full of rack mounted servers will include multiple access panels located in the exterior walls of the shipping container. In some instances, the access panels can be removed to provide maintenance access the rear of the racks, and to the rear of the servers mounted within the racks. If the servers rely upon ambient air cooling, it may even be necessary to remove the access panels so that the air blown out of the rear of the servers can be vented into the atmosphere in the data warehouse facility. This would mean that the access panels must be removed in order to operate the servers and to allow them to cool themselves.

Because these types of transportable shipping containers are typically located inside a data warehousing facility, it is acceptable to remove the access panels in the exterior walls of the shipping container, to thereby expose the rear of the racks and the servers. Because the container and the servers are located inside a warehouse, the servers are not exposed to a harmful environment.

In some instances, it may be desirable to locate a shipping container of servers outdoors. In this instance, removing the access panels on the exterior walls of a shipping container might expose the servers to harmful environmental conditions. And if the environmental conditions outside the shipping container are harmful, it may be impossible to operate the servers or to perform certain maintenance operations without damaging the servers. This means that such a shipping container may not be usable in certain outdoor environments.

Another problem with locating such a shipping container outside a data warehouse relates to the cooling requirements of the servers. As noted above, many shipping containers do not include any cooling equipment. If the servers rely upon air cooling alone, the ambient temperature surrounding the shipping container must be at a sufficiently low temperature to ensure that the servers can be operated without damage. Thus, it may be impossible to operate such a shipping container in a location with a high ambient temperature.

If such a shipping container relies upon an external source of cooling water, the shipping container could be located only where there is a good external source of cooling water. This could be accomplished by locating the container adjacent a river or a lake and using that water for cooling. Alternatively, if there is no natural body of water that can be used for cooling, it will be necessary to provide equipment, such as cooling towers, to remove heat from water that is circulated to the servers for cooling.

The shipping containers described above are usually fully populated with racks of servers. In other words, when a data warehousing facility wishes to increase its data processing capabilities, the data warehousing facility will typically add an entire shipping container full of rack-mounted servers. This often results in the provision of significantly more processing capability than is required. There is no provision with the existing shipping containers with rack-mounted servers to only partially populate the space within the shipping container.

DETAILED DESCRIPTION OF PREFERRED EMBODIMENTS

Figure 1:
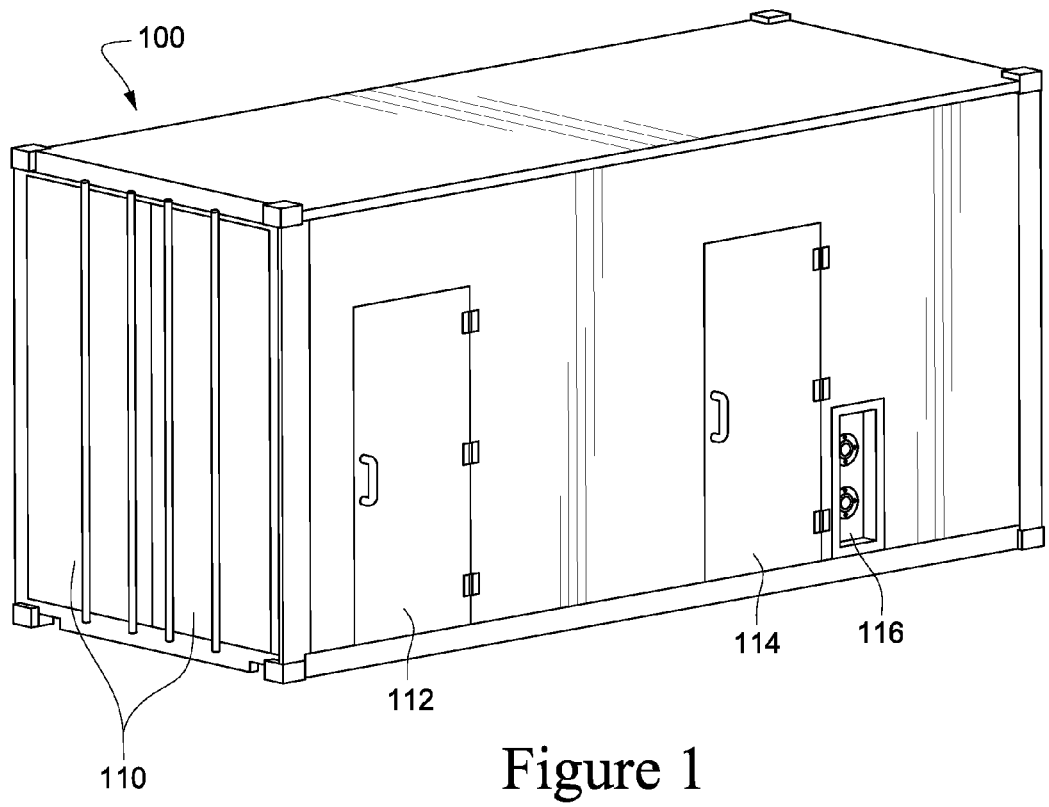
FIG. 1 is a perspective view of the exterior of a shipping container in which computer servers are mounted.

A shipping container containing racks of servers is illustrated in FIG. 1. The shipping container 100 includes side doors 112, 114 and end doors 110. In addition, a cooling water interface 116 is located on a sidewall of the container. In alternate embodiments, the cooling water interface 116 could be located on any of the exterior walls, the top wall or the bottom wall.

Figure 2:
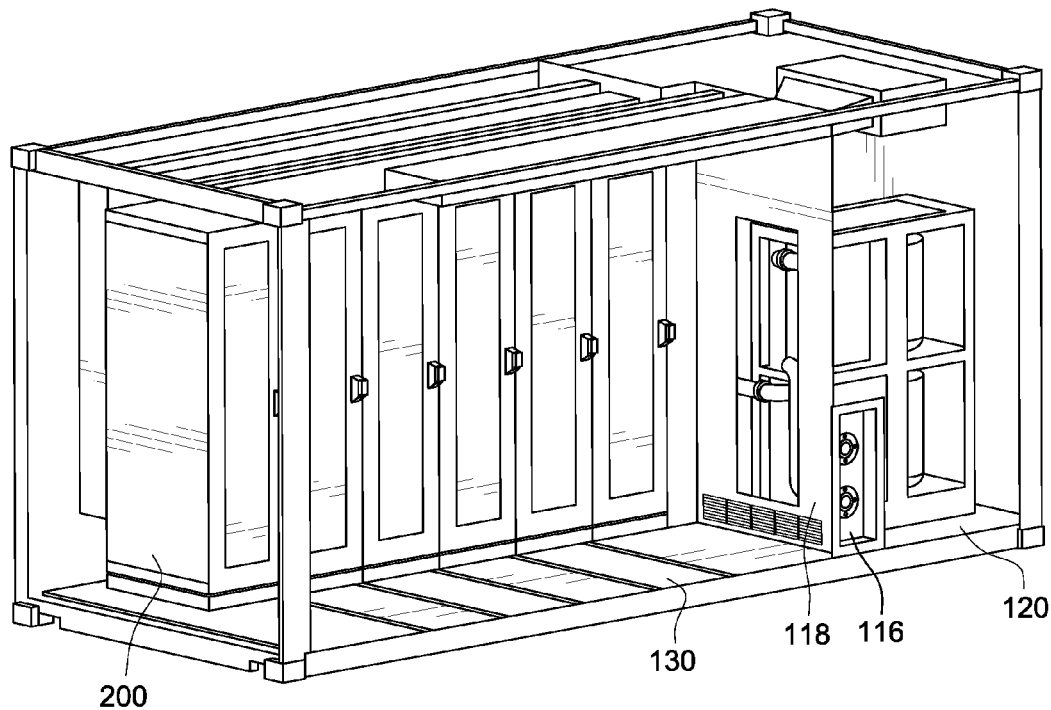
FIG. 2 is a perspective view of the shipping container with the sidewalls and top wall removed.

FIG. 2 is a perspective view of the shipping container with the exterior walls removed. As shown in FIG. 2, a plurality of rack enclosures 200 are mounted within the container 100. An interior wall 118 separates a server room 130 from a separate equipment room 120. The equipment room 120 includes power and data distribution equipment, cooling systems and control systems which are used to keep the computer servers mounted in the rack enclosures 200 operational. Details of the equipment room 120 are discussed below. Note, however, that the cooling water interface 116 opens into the equipment room 120.

Figure 3:
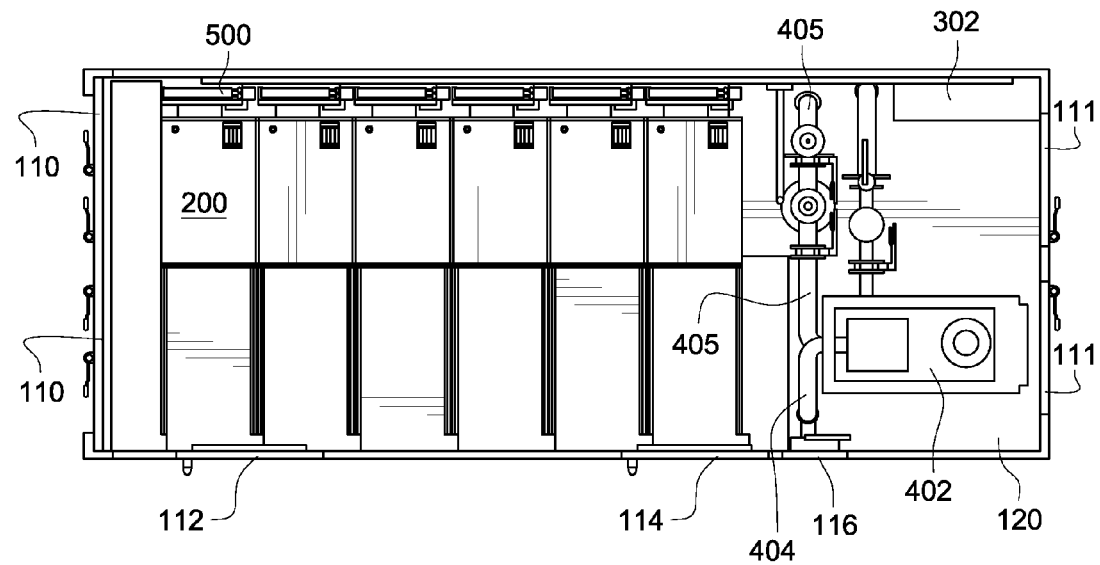
FIG. 3 is a top view of the shipping container with the roof removed.

FIG. 3 is a top view of the shipping container with the top wall removed. As shown in FIG. 3, six rack enclosures 200 are mounted in front of six corresponding enclosure cooling units 500. The enclosure cooling units 500 are described in more detail below.

Although this embodiment includes only six rack enclosures 200, in alternate embodiments the dimensions of the shipping container may allow for additional rack enclosures to be installed. Also, as explained in more detail below, in alternate embodiments a shipping container may not include all of the equipment shown in FIGS. 1-3. If the equipment room 120 is not present, or is at least smaller, this would allow space for more rack enclosures 200 to be installed in the shipping container.

As also shown in FIG. 3, cooling fluid pipes 404 connected the cooling water interface 116 to a cooling unit 402 located in the equipment room 120. A separate set of cooling fluid pipes 405 connect the cooling unit 402 to the enclosure cooling units 500, as is described in more detail below.

As also illustrated in FIG. 3, a power distribution panel 302 is located in the equipment room 120. As is described in more detail below, power connections to the servers in the rack enclosures 200 are established through the power distribution panel 302. Data connections might also be established to the servers through the power distribution panel 302. Alternatively, a separate data distribution panel may be provided, as described in more detail below.

Figure 4:
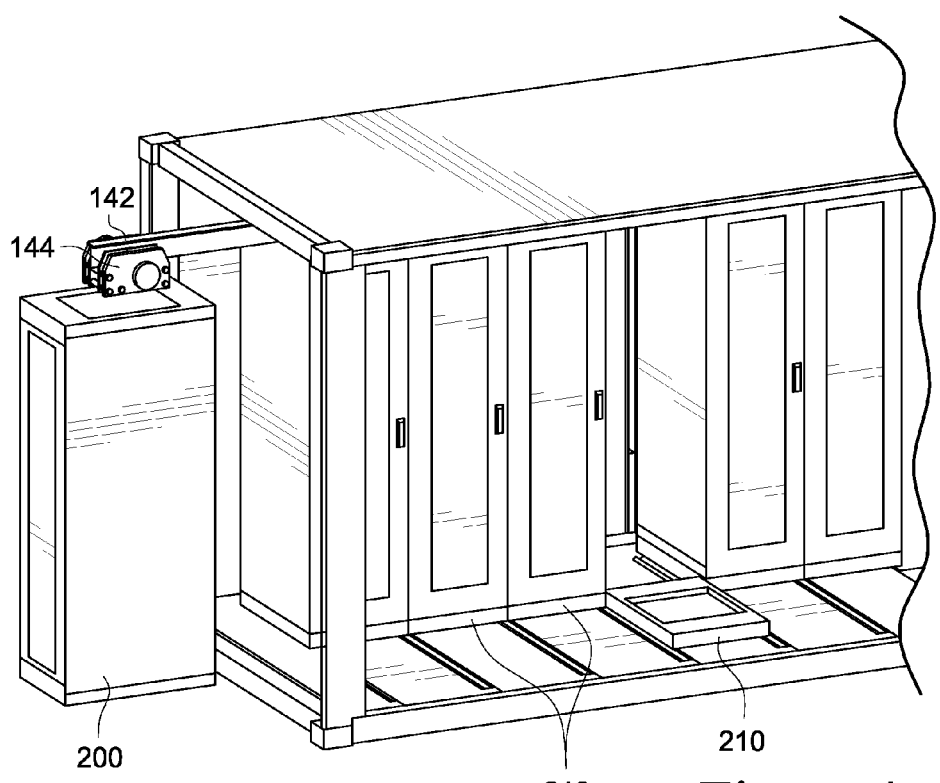
FIG. 4 is a perspective view of the shipping container illustrating how an overhead rail can extend out from an end of the shipping container.

FIG. 4 illustrates that an overhead rail 142 is movably mounted on the ceiling of the shipping container 100. The overhead rail 142 is used to help transport individual rack enclosures 200 into and out of the shipping container.

A hoist unit 144 is mounted on the overhead rail 142. The hoist unit 144 can be connected to a rack enclosure 200 and it can raise and lower the rack enclosure 200 relative to the overhead rail 142. The hoist unit 144 can also move along the overhead rail 142 to position the rack enclosures 200 at desired locations within the shipping container.

The overhead rail 142 can be positioned entirely inside the shipping container. Or, as illustrated in FIG. 4, the overhead rail 142 can extend out of the shipping container. This allows the hoist unit 144 to be attached to a rack enclosure 200 located outside the shipping container. The hoist unit 144 can then lift the rack enclosure 200 upward, and the rack enclosure 200 can be moved along the overhead rail 142 to a position inside the shipping container.

As also illustrated in FIG. 4, each rack enclosure 200 is mounted on a movable base unit 210. As is described in more detail below, the movable base unit 210 is movably mounted on rails so that once a rack enclosure has been mounted on the movable base unit 210, the base unit and the rack enclosure can be moved toward and away from the sidewall of the shipping container.

Figure 5:
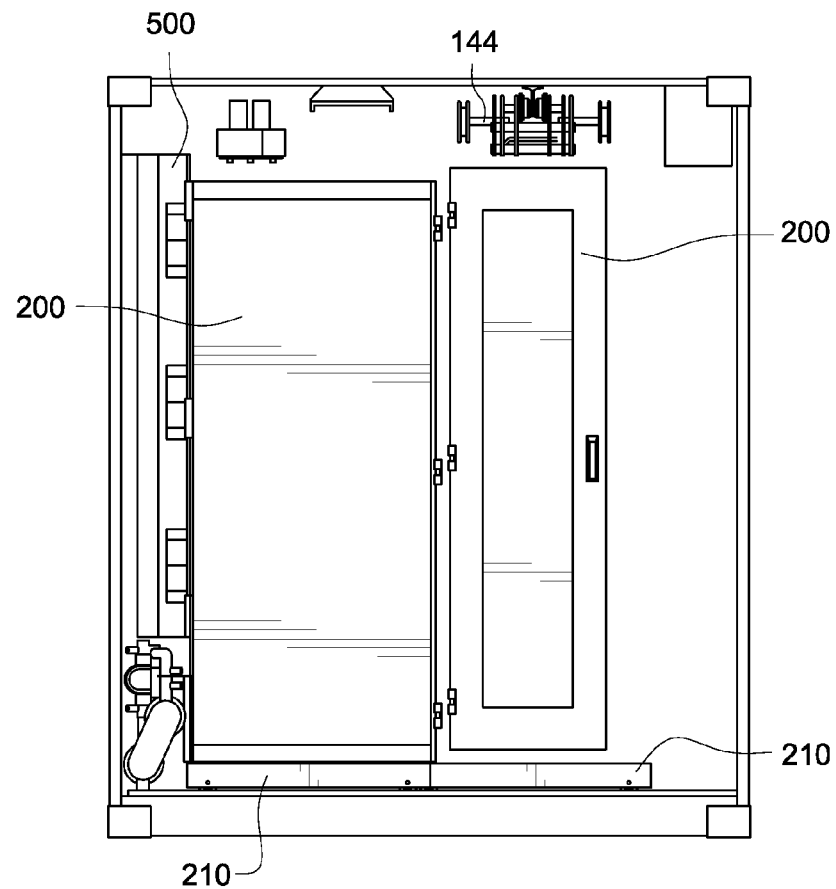
FIG. 5 is an end view of the shipping container showing a rack enclosure 200 suspended from a hoist mechanism.

FIG. 5 is a side view of the interior of the shipping container showing a rack enclosure 200 suspended from the hoist unit 144 over top of a movable base unit 210. Once the rack enclosure 200 has been positioned over top of the movable base unit 210, it is lowered by the hoist unit 144 down onto the top of the movable base unit 210.

Figure 6:
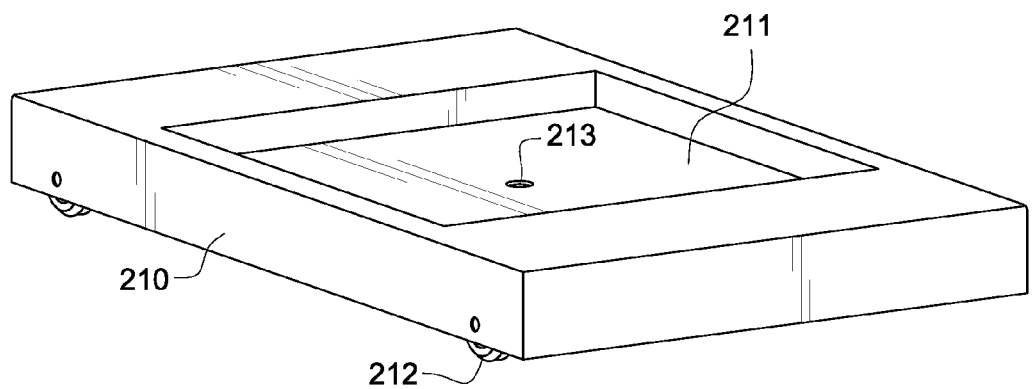
FIG. 6 is a perspective view of a movable base unit of a rack enclosure mounted on rails.

FIG. 6 is a perspective view illustrating a movable base unit 210. Rotatably mounted wheels 212 are attached to the bottom of the movable base unit 210. A depression 211 is formed on the top of the movable base unit 210. The depression receives a swivel mechanism located on the bottom of a rack enclosure, as is described in greater detail below. Also, a central pivot hole 213 is located at the center of the depression 211.

Figure 7:
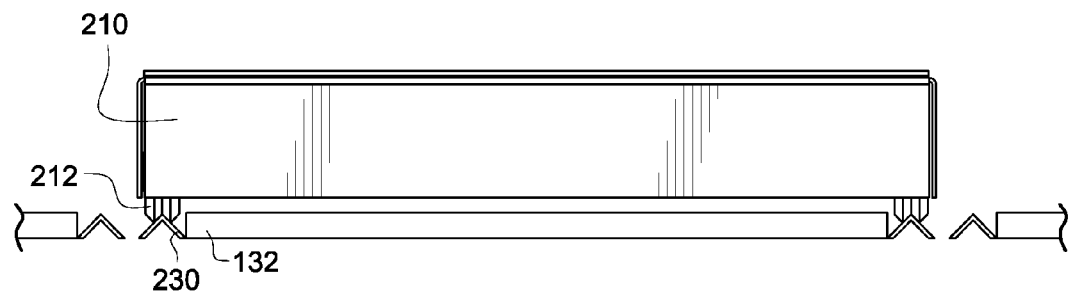
FIG. 7 is an end view of the movable base unit mounted on rails.

FIG. 7 is a front elevation view of a movable base unit 210 mounted on a pair of rails 230. As illustrated in FIG. 7, the rotatable wheels 212 mounted on the movable base unit 210 have a groove at the center. The groove at the center of the wheels 212 receives the peaked center of the rail 230. The groove in the center of the wheels 212 and the peaked shape of the rails 230 ensure that the movable base unit remains mounted on the rails, as sideways movement of the base unit 210 with respect to the rails 230 is prevented.

Although the embodiment illustrated in FIG. 7 includes peaked rails 230 and wheels 212 with a V-groove, in alternate embodiments the wheels and rails could have different shapes and configurations. Preferably, however, the wheels and the rails will cooperate to ensure that the movable base unit 210 remains mounted on the rails. For instance, the wheels and rails could be configured like a typical railroad and train. Specifically, the rails could have an I-beam shape, and the wheels 212 could include interior or exterior depending edges which would act to prevent the movable base unit 210 from moving sideways with respect to the rails. Any other type of rail or wheel configuration could also be used.

In addition, in some embodiments movable base units 210 could simply include flat bottomed wheels which rest upon the top surface of the floor 132 of the shipping container. In other words, in some embodiments, no rails would be provided and the movable base unit 210 would simply include wheels which allow a movable base unit 210 and an attached rack enclosure 200 to be slid forward and backward along the top surface of the floor 132 of the shipping container.

In the embodiment illustrated in FIG. 7, the rails 230 are recessed below the top surface of the floor 132 of the shipping container. As a result, personnel walking within the shipping container are unlikely to trip over the rails 230. In alternate embodiments, the rails could be mounted on the top surface of the floor 132 of the shipping container. In still other embodiments, the rails could be mounted on raised portions on the floor 132 of the shipping container.

Figure 8:
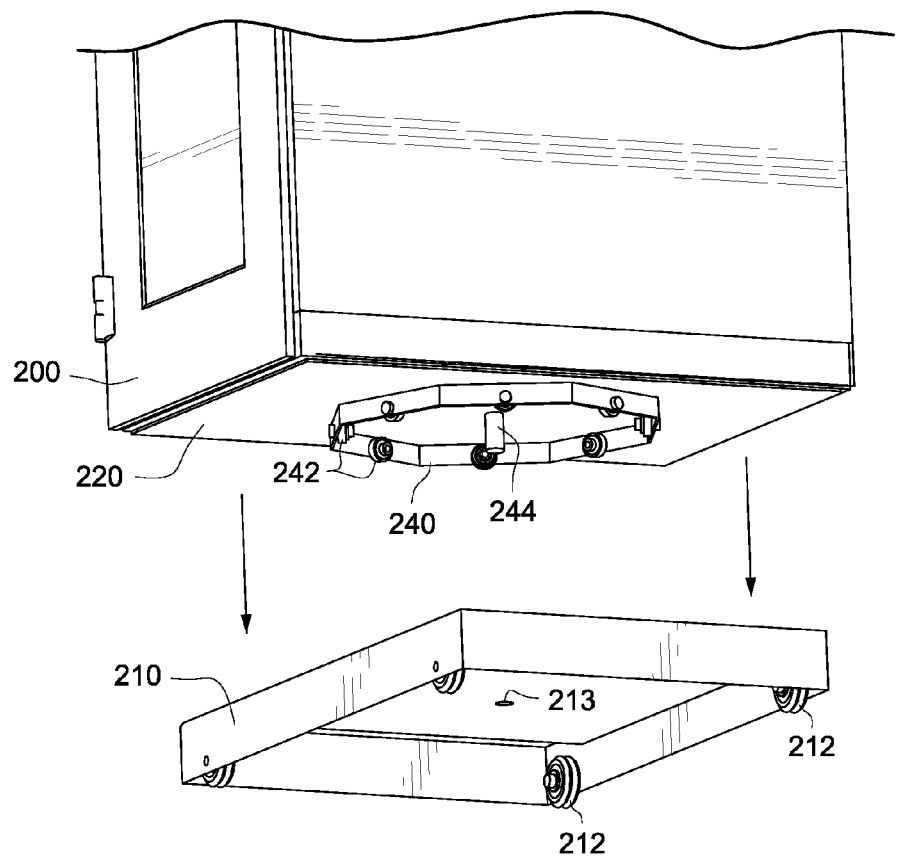
FIG. 8 is a perspective view of the bottom of a rack enclosure showing a swivel mechanism that allows a rack enclosure to pivot on top of a movable base unit.

FIG. 8 shows a swivel mechanism mounted on the bottom of a rack enclosure. The swivel mechanism includes a side frame 240 which is attached to a swivel plate 220 on the bottom of the rack enclosure. A plurality of wheels 242 are rotationally mounted on the side frame 240. The bottom surfaces of the wheels 242 extend down below the bottom of the side frame 240.

A rotational axis 244 extends downward from the swivel plate 220 on the bottom of the rack enclosure 200. When a rack enclosure is lowered onto a movable base unit, the rotational axis 244 is received in the central pivot hole 213 on the movable base unit. The side frame 240 and wheels 242 are received in the depression 211 on the top of the movable base unit 210. Because the wheels 242 rest on the surface of the depression 211, the swivel plate 220 and rack enclosure are held above the top surface of the movable base unit 210. The wheels 242 allow the rack enclosure 200 to rotate on the top of the movable base unit 210.

In alternate embodiments, the side frame 240 may be attached to the floor of the depression 211 on the top of the movable base unit 210. In this instance, the wheels 242 would extend upward above the side frame 240 and the top of the movable base unit 210. In this embodiment, the bottom of the swivel plate 220 would rest against and be supported by the wheels 242, which would also allow the swivel plate 220 and the rack enclosure 200 to rotate with respect to the movable base unit 210. In still other embodiments, a different type of rotational mechanism could be used instead of the ones described above. For instance, a ball bearing swivel mechanism could be installed between the movable base unit 210 and the swivel plate 220. Any type of swivel mechanism that allows the swivel plate 220 and the rack enclosure 200 to rotate with respect to the movable base unit 210 could be used.

The fact that a rack enclosure 200 is able to rotate with respect to the underlying movable base unit 210 provides multiple advantages. As will be explained in more detail below, this allows the rack enclosures 200 to be easily installed in the shipping container. Also, allowing the rack enclosures to pivot makes it easier to access the rear of the rack enclosures, and the rear of any servers mounted therein, for purposes of electrical attachment and maintenance.

Figure 9:
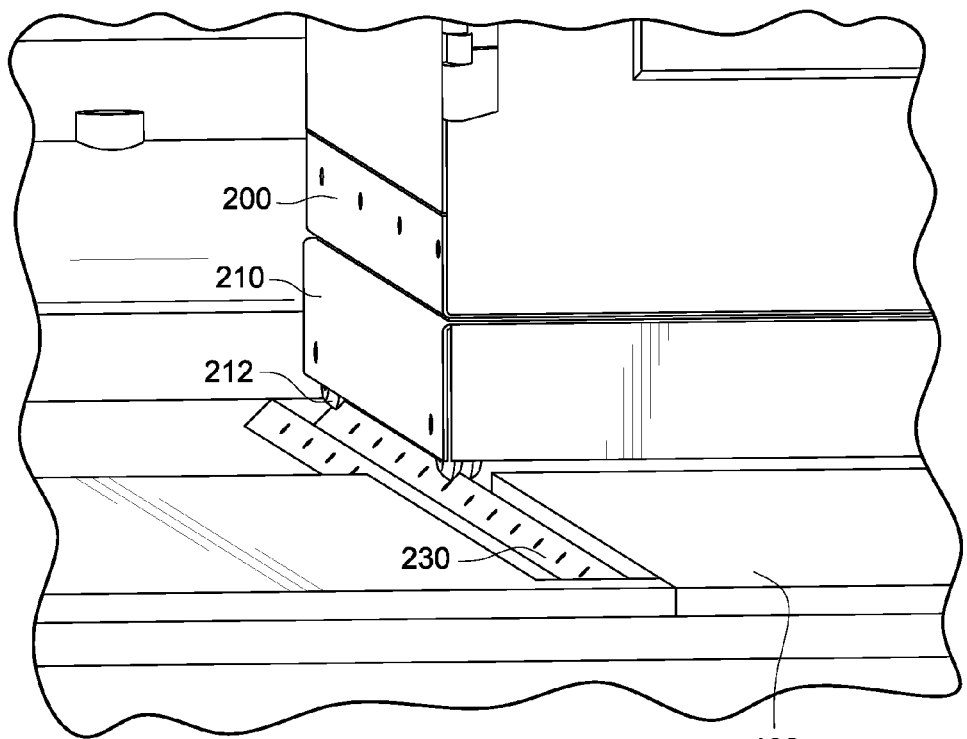
FIG. 9 is a perspective view of a rack enclosure on top of a movable base unit.

FIG. 9 illustrates a rack enclosure 200 mounted on a movable base unit 210. As also illustrated in FIG. 9, the movable base unit 210 is movably mounted on rails 230. This allows the rack enclosure and movable base unit to be slid forward and backwards with respect to the sidewall of the shipping container.

Figure 10:
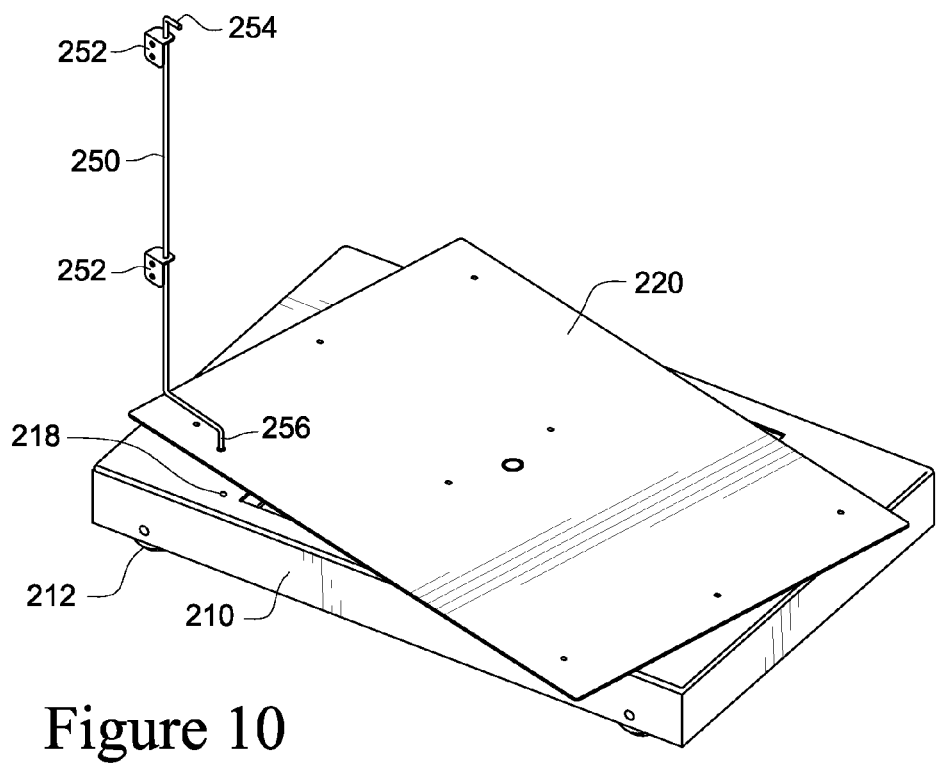
FIG. 10 is a perspective view of a movable base unit with a swivel plate that would normally be attached to the bottom of a rack enclosure partially rotated with respect to the base.

FIG. 10 illustrates a locking mechanism which can be used to lock the swivel plate 220 and the attached rack enclosure 200 with respect to the movable base unit 210 so that the swivel plate 220 and rack enclosure 200 cannot rotate with respect to the movable base unit 210. Although the rack enclosure 200 has been removed for purposes of explaining the locking mechanism, normally a rack enclosure would be located on top of and be attached to the swivel plate 220.

The locking mechanism includes a locking bar 250 which is slidably mounted within mounting brackets 252. As described below, the mounting brackets 252 are attached to the interior of a rack enclosure. This allows the locking bar 250 to be moved upward and downward with respect to the rack enclosure, the swivel plate 220 and the underlying movable base unit 210.

Figure 11:
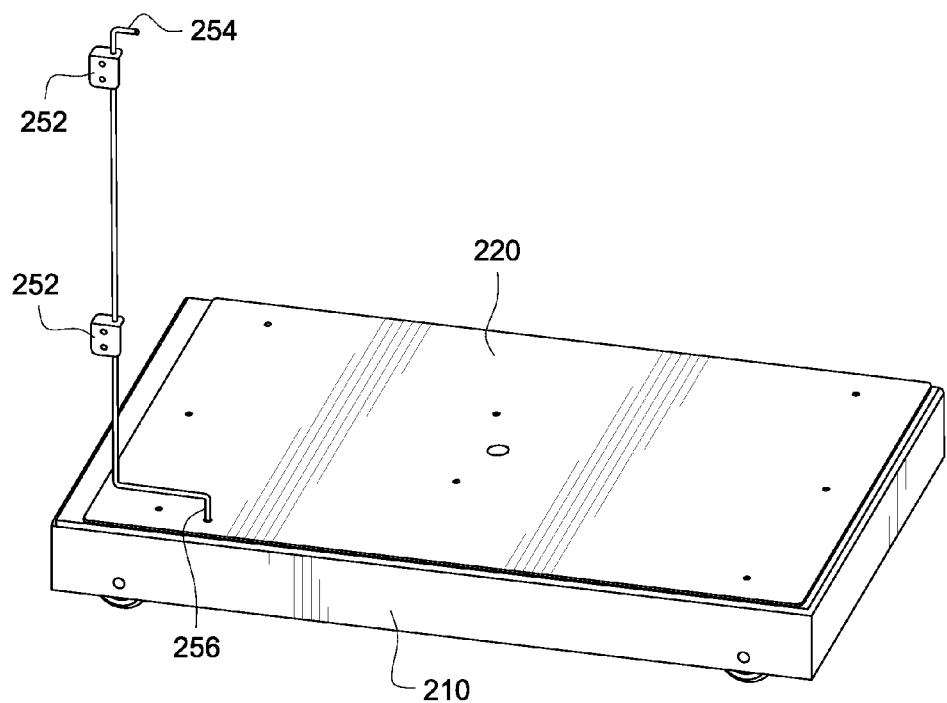
FIG. 11 is a perspective view of a movable base unit with a swivel plate that would normally be attached to the bottom of a rack enclosure aligned with the base.

A handle 254 is located at the upper end of the locking bar 250. A locking pin 256 is located at the lower end of the locking bar 250. The locking pin 256 is configured to extend downward through an aperture in the swivel plate 220 and into an underlying locking aperture 218 formed on the movable base unit 210. When the locking bar 250 is pulled upward, using the handle 254, the locking pin 256 is removed from the locking aperture 218 on the base unit 210. This allows the swivel plate 220 to rotate with respect to the movable base unit 210. When the swivel plate 220 is rotated into a position as illustrated in FIG. 11, the locking bar 250 can be moved downward so that the locking pin 256 extends through the swivel plate 220 and into the locking aperture 218 on the movable base unit 210. As a result, the swivel plate 220 and attached rack enclosure are prevented from rotating with respect to the movable base 210.

Figure 13:
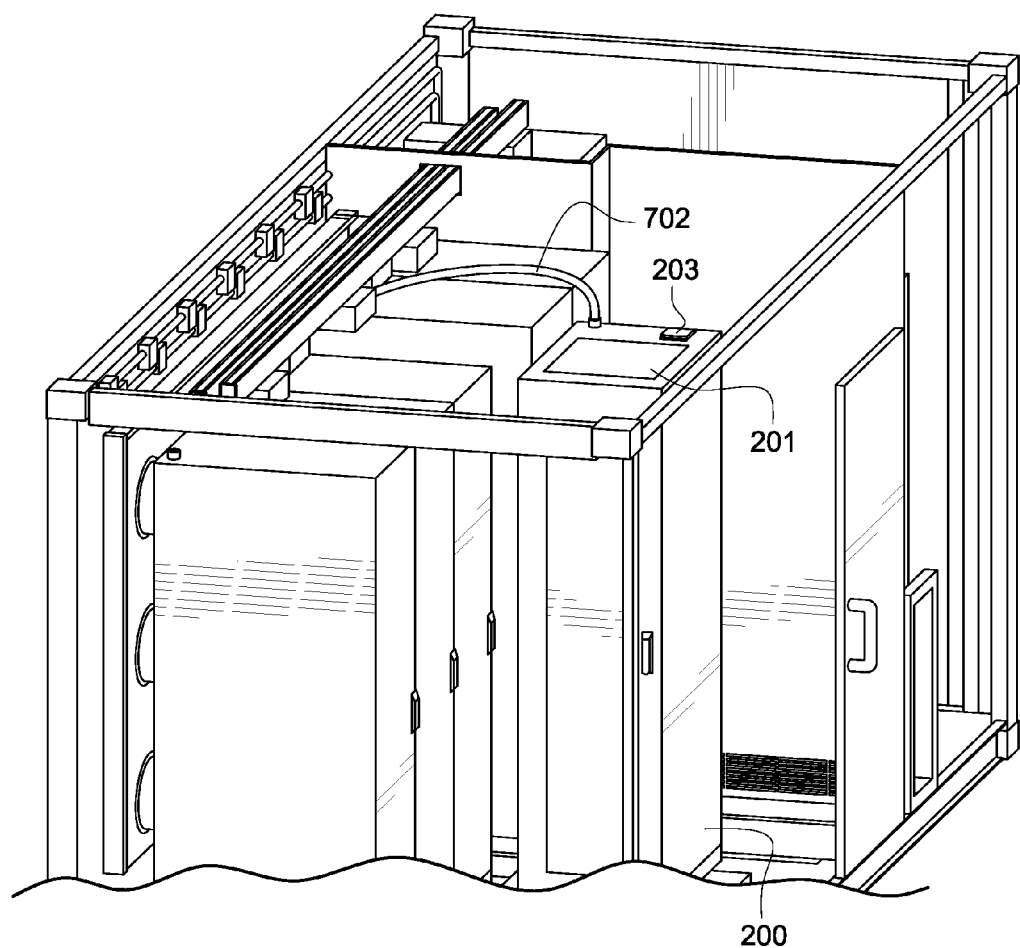
FIG. 13 is a perspective view showing a rack enclosure pulled away from a side wall and rotated for maintenance access.

Although not shown in FIGS. 10 and 11, a similar second locking aperture may be located at a different position on the movable base unit 210. The second locking aperture could be used to lock the swivel plate 220 and attached rack enclosure in a different rotational orientation with respect to the base unit 210. For instance, a second locking aperture could be provided on the movable base unit 210 at a position that causes the swivel plate to be locked into a position which is rotated 90° with respect to the position illustrated in FIG. 11. This would hold the swivel plate 220 and rack enclosure 200 in a position as illustrated in FIG. 13. Of course, a plurality of locking apertures could be provided at different positions on the movable base unit 210 to allow the swivel plate 220 to be held in a variety of different rotational positions with respect to the base unit 210.

Holding the swivel plate 220 in the position illustrated in FIG. 13 would allow a rack enclosure 200 to be easily mounted on or dismounted from the movable base unit 210 when the rack enclosure 200 is being carried by the hoist unit 144. In addition, once a rack enclosure is mounted on a movable base unit 210, and the movable base unit has been slid away from the sidewall of the shipping container and into the aisle in front of the other rack enclosures, holding the rack enclosure 200 in the position illustrated in FIG. 13 would allow maintenance personnel to easily access the rear of the rack enclosure, and the rear of any severs mounted therein.

In some embodiments, the locking bar 250 may be manually operated, and gravity alone will prevent the locking pin 256 from moving out of the locking aperture 218. In alternate embodiments, the locking 250 bar may be biased downward so that the locking pin 256 is biased into engagement with the locking aperture 218.

In still other embodiments, a completely different locking mechanism may be provided to prevent the swivel plate and rack enclosure from rotating with respect to the base unit. Any locking mechanism capable of holding the swivel plate and rack enclosure in a certain rotational position, or in a plurality of different rotational positions, could be used.

Figure 12:
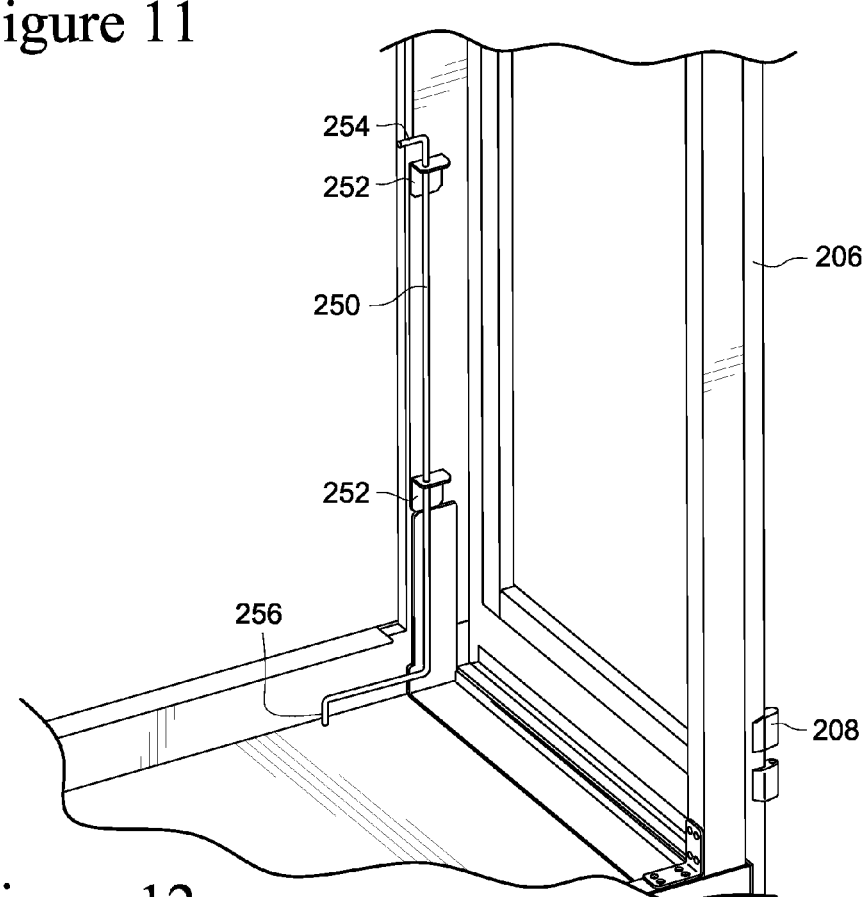
FIG. 12 is a perspective view of interior portions of a rack enclosure illustrating how a locking mechanism can be mounted on an inner wall of the rack enclosure.

FIG. 12 is a partial perspective view of the interior of the front of a rack enclosure 200. As illustrated in FIG. 12, the mounting brackets 252 of a locking mechanism as illustrated in FIG. 10 are attached to an interior sidewall of the rack enclosure at the front of the rack enclosure. This allows the locking bar 250 to be moved upward and downward within the interior of the rack enclosure. As also illustrated in FIG. 12, the locking pin 256 extends downward through the bottom of the rack enclosure, through the swivel plate 220 and then downward into the locking aperture on the movable base 210.

As also illustrated in FIG. 12, a door 206 can be mounted on the front of the rack enclosure 200 via a plurality of hinges 208. This allows a user to open the door 208 to gain access to the servers mounted within the rack, and also to gain access to the handle 254 of the locking bar 250. The door also seals the front of the rack enclosure, which can be advantageous, as described in more detail below.

As a result of all of the mechanisms described above, it is possible to move a rack enclosure 200 into an interior of the shipping container using the hoist 144 and overhead rail 142 to a position over top of a movable base unit 210, as illustrated in FIGS. 5 and 13. Once the rack enclosure 200 has been lowered onto the movable base unit 210, the hoist unit 144 can be detached from the rack enclosure 200, as also illustrated in FIG. 13.

When the rack is positioned as shown in FIG. 13, maintenance and installation personnel can access the front and rear of the rack enclosure, as well as the front and rear of any servers mounted within the rack enclosure. This allows the maintenance and installation personnel to attach/detach the servers to data and power wiring, and to perform other maintenance and installation operations. As is apparent from FIG. 13, when the rack enclosure is located in the aisle of the shipping container, and rotated 90° with respect to the other rack enclosures 200, maintenance personnel can still walk past the rack enclosure in the aisle to move between the front and rear sides of the rack enclosure 200.

FIG. 13 also shows that a first umbilical cord 702 is attached to the top of 201 of the rack enclosure 200. Power lines passing through the umbilical cord 702 can be attached to the servers mounted in the rack enclosure. Although FIG. 13 shows only a single umbilical cord attached to the top of a rack enclosure, in some embodiments multiple umbilical cords would be attached to each rack enclosure. Details of the umbilical cords 702 and the power and data connections are described in more detail below.

Figure 14:
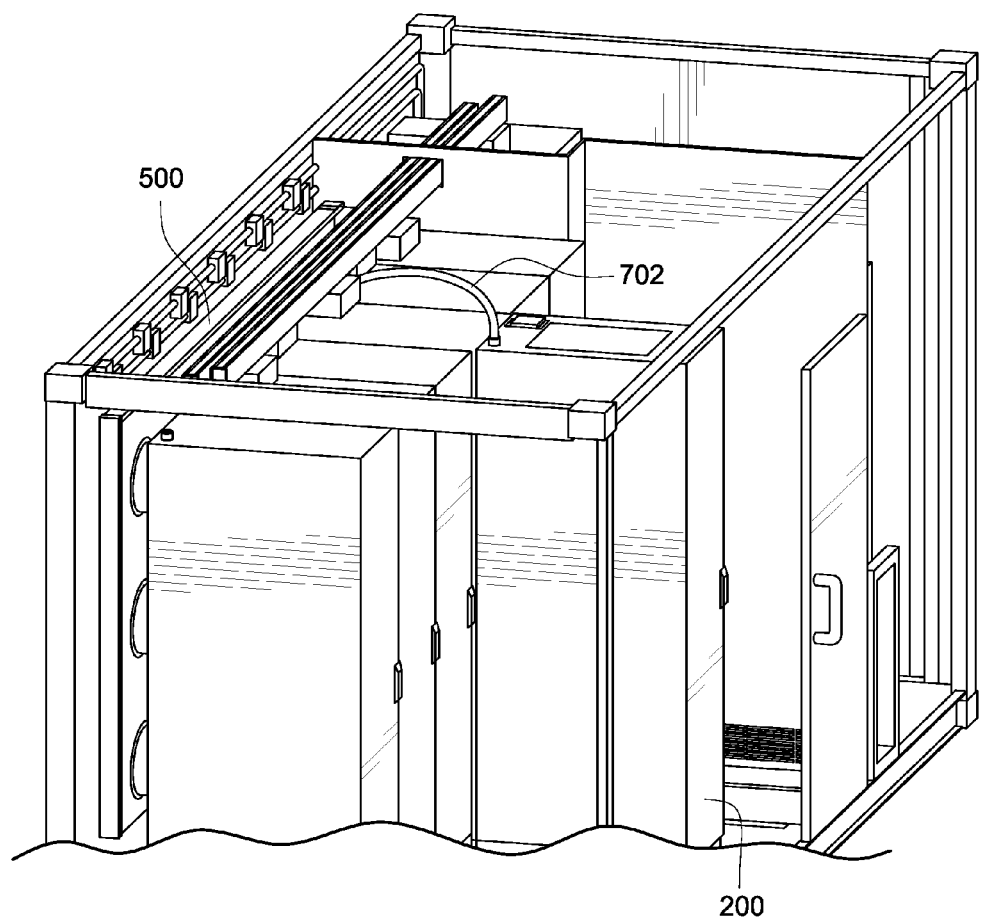
FIG. 14 is a perspective view showing a rack enclosure pulled away from a side wall.

If a rack enclosure is being installed into the shipping container, once the rack enclosure 200 has been mounted onto a movable base unit 210, as illustrated in FIG. 13, the rack enclosure 200 can be rotated 90° to the position illustrated in FIG. 14. This aligns the rack enclosure 200 with the other rack enclosures 200 within the shipping container. As explained above, a locking mechanism can be used to lock the rack enclosure 200 in the position illustrated in FIG. 14 with respect to the movable base unit 210. The rack enclosure 200 and the movable base unit 210 can then be slid backward along the rails on the floor of the shipping container so that the rack enclosure 200 is brought adjacent an enclosure cooling unit 500 located on the sidewall of the shipping container, as illustrated in FIGS. 2 and 3.

As illustrated in FIG. 13, a data cable port 203 may be located on the top of a rack enclosure. The data cable port could include some deformable material which allows data cables to be run from outside the rack enclosure to the interior of the rack enclosure, while still maintaining a relatively airtight seal around the data cables. For instance, the data cable port 203 might include a plurality of bristles or semi-rigid fibers that can be pushed aside to allow a data cable to be inserted through the data cable port 203. Once inserted, the bristles or semi-rigid fibers would provide a partially air-tight seal around the data cables. This would allow the interior of the rack enclosure to be substantially sealed from the surrounding atmosphere.

Figure 15:
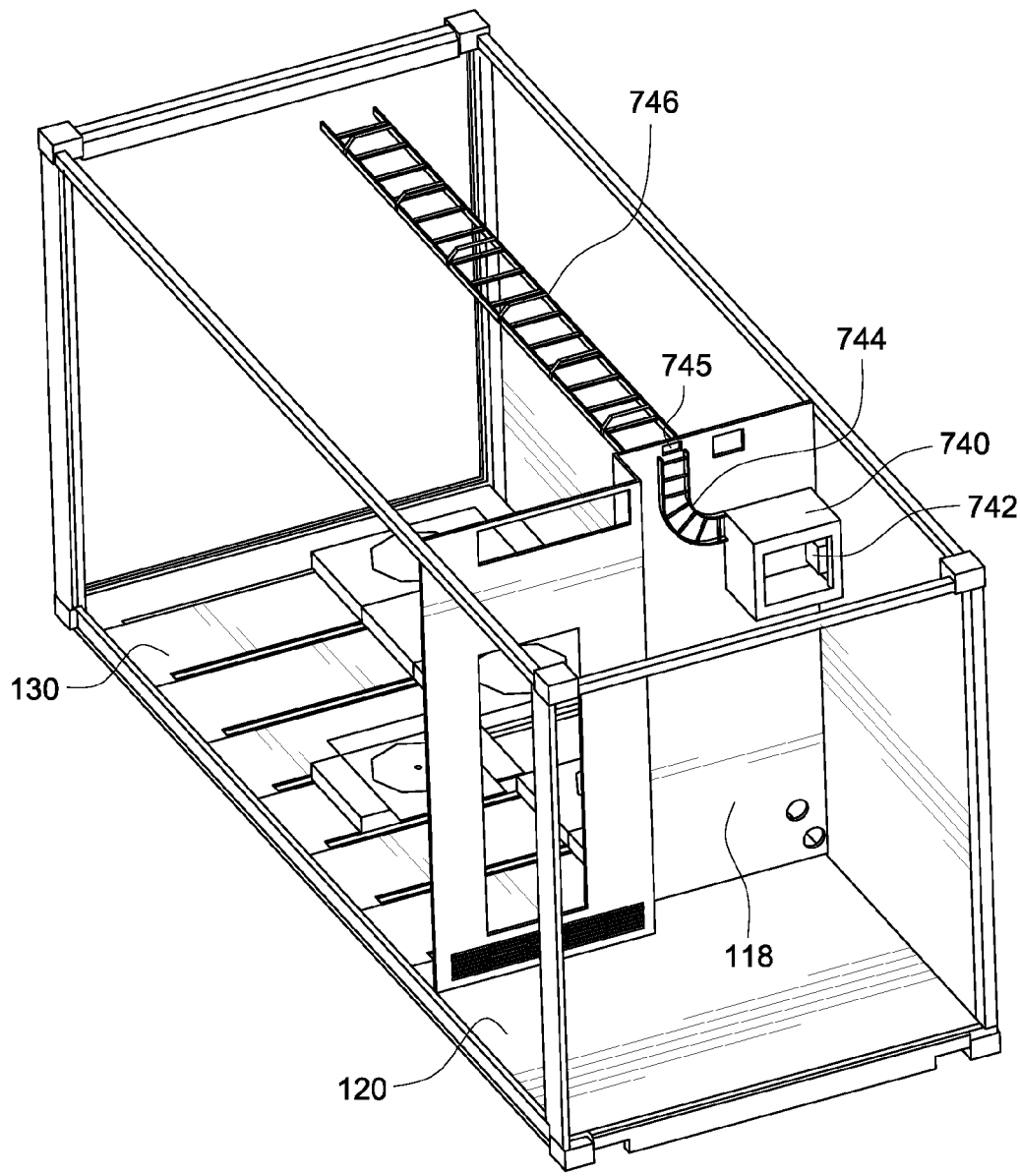
FIG. 15 is a perspective view of a shipping container illustrating the support structure for routing data lines through the interior of the container.

FIG. 15 illustrates elements of a supporting system that is used to suspend data cables within the interior of the shipping container. An external port 742 is formed on the sidewall of the shipping container to allow data cables to run into and out of the shipping container. The external port 742 opens into a data distribution box 740. Various junction and distribution equipment could be located in the data distribution box 740, as is well known to those skilled in the art.

A data cable ladder 744 runs from the data distribution box 740 to a hole 745 penetrating the interior wall 118 that separates the equipment room 120 from the server room 130. Data cables would run along the data cable ladder 744 and then through the hole 745 in the interior wall 118. The data cables would then run along a cable ladder 746 mounted on the ceiling of the server room 130. Individual data cables would extend down from the cable ladder 746 and into individual rack enclosures via the data cable ports 203 on the top of the rack enclosures, as described above.

Figure 16:
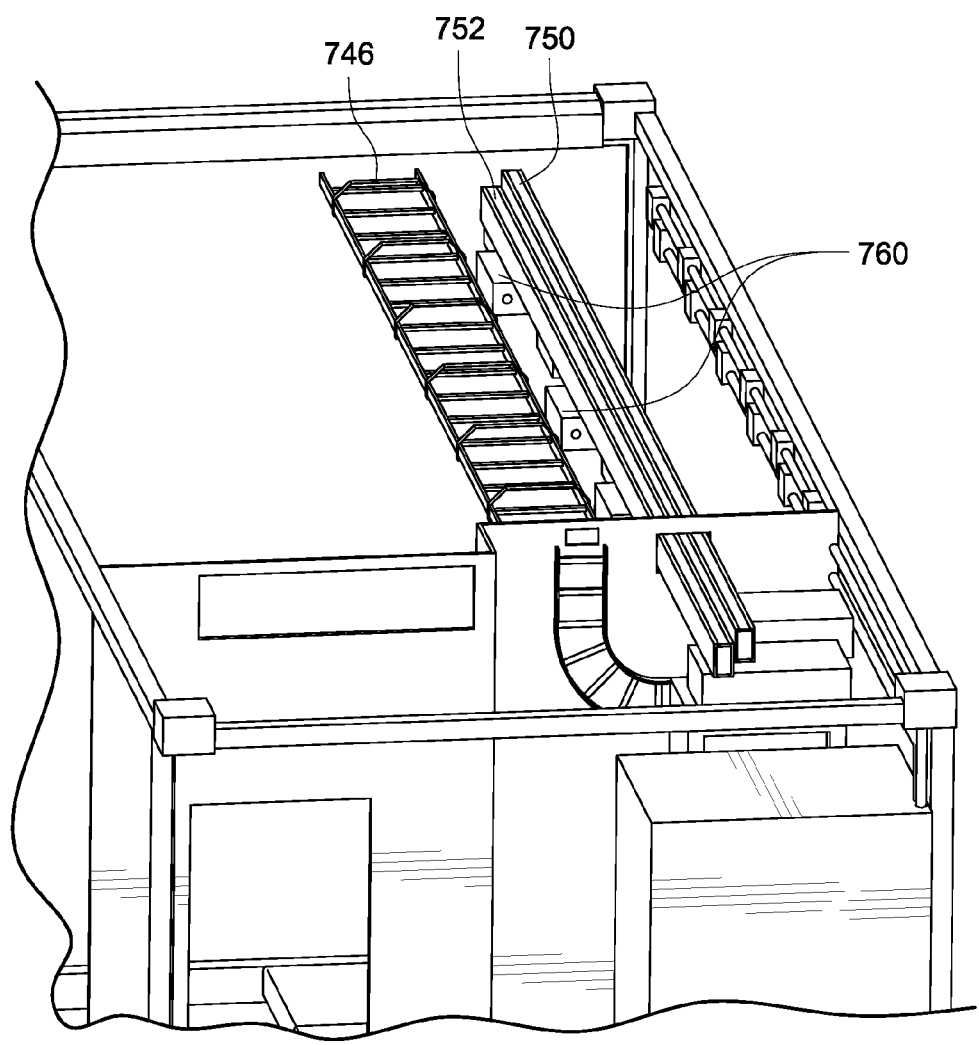
FIG. 16 is a partial perspective view of a shipping container showing how power conduits and junction boxes are mounted in the container.
Figure 17:
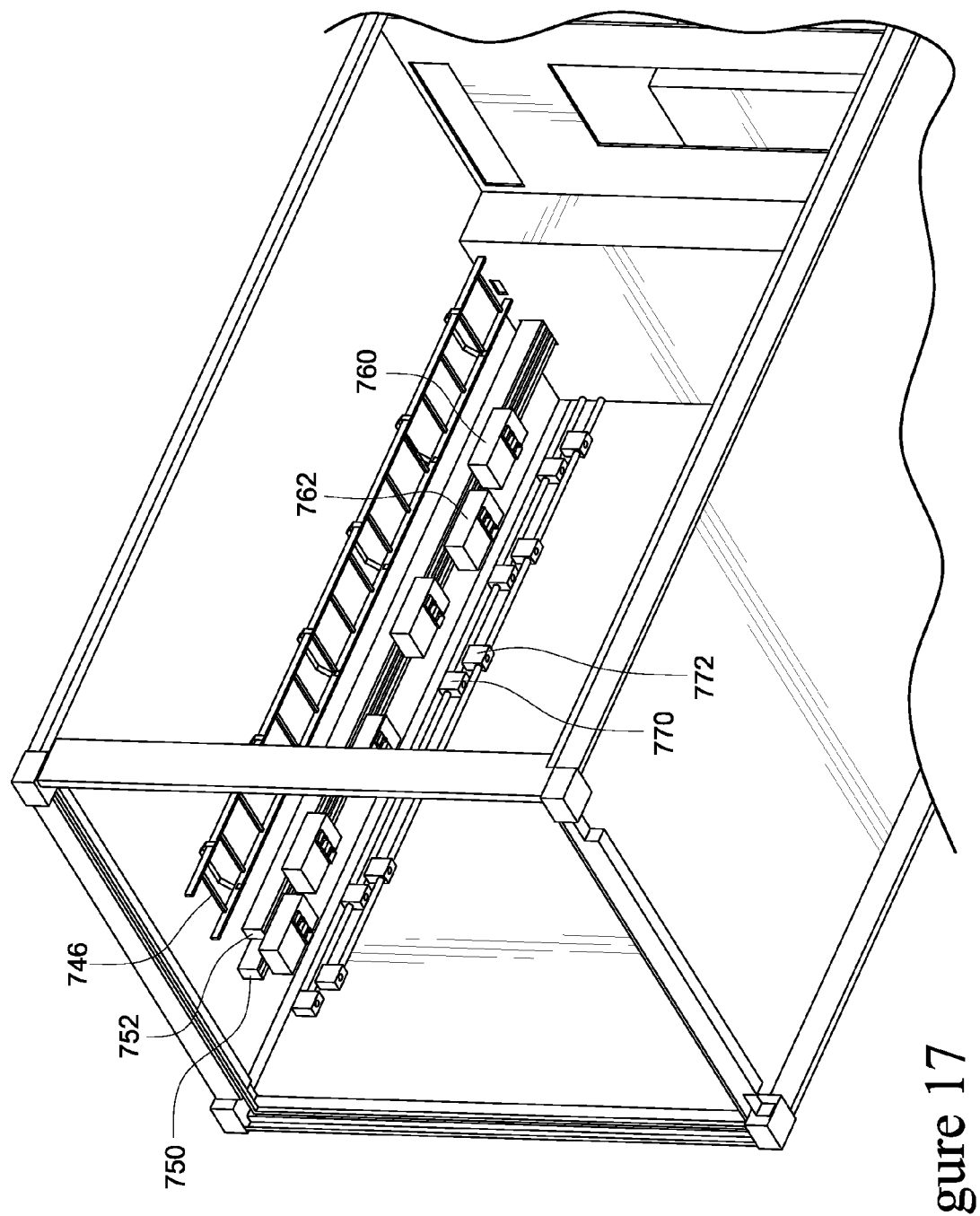
FIG. 17 is a partial perspective view of a shipping container illustrating the relative positions of the power conduits, the fan and pump conduits and the support structure for data lines.

FIGS. 16 and 17 illustrate elements of the electrical power distribution system. As illustrated, there are two separate power line conduits 750, 752 mounted on the ceiling of the server room 130. Power junction boxes 760, 762 are located at various places along the power line conduits 750, 752. Each power line conduit provides an independent supply of electrical power to all of the rack enclosures mounted in the server room 130. Thus, the power line conduits are intended to be fully redundant. The power lines within each power line conduit 750, 752 are attached to separate power supply circuits having separate fuses or circuit breakers.

Umbilical cords run from the power junction boxes 760, 762 to the rack enclosures. Each rack enclosure will be connected to two umbilical cords. Each rack enclosure will be connected to a first umbilical cord with power lines connected to the first power line conduit 750, and a second umbilical cord with power lines connected to the second power line conduit 752. As a result, if the power running along one power line conduit fails, the servers will still be able to draw power from the other power line conduit. In this arrangement, one or multiple umbilical cords may extend from each power junction box 760, 762.

As explained above, in many portable shipping containers with rack mounted servers, cooling of the servers is accomplished using cooled ambient air from within a data warehouse facility. The servers draw in cool ambient air produced by the warehouse environmental control system, and the servers vent hot air back into the warehouse facility.

As also explained above, some portable shipping containers with rack mounted servers may include a water cooling system that helps the servers to remain cool. However, the shipping container itself has no way of cooling the water. Instead, the shipping container makes use of an external supply of cooling water. In many such systems, the externally supplied cooling water must be supplied to the shipping containers at temperatures of 40-55° F.

A shipping container as described in the present application includes a closed loop fluid cooling system to help keep the servers cool. In some embodiments, the closed loop fluid cooling system can make use of an external source of cooling water to cool the fluid inside the closed loop. However, in these embodiments, the externally supplied cooling water need not be supplied to the shipping container at temperatures as low as 40-55° F. Instead, the closed loop fluid cooling system can utilize externally supplied cooling water at much higher temperatures.

In other embodiments, the closed loop fluid cooling system may make use of ambient air from outside the shipping container to cool the fluid within the closed loop system. In still other embodiments, a chiller or refrigeration system may be provided to cool the fluid in the closed loop. In both of these instances, there would be no need whatsoever for an external supply of cooling water.

If ambient air is used to cool the fluid within the closed loop system, the cooling unit may include one or more filters and a water removal device that helps to condition the air before it is drawn into the cooling unit and used to cool the fluid in the closed loop.

If a refrigeration system is used, there is no need for either an external supply of cooling water, or ambient air. Instead, all that would be required is electrical power to run the cooling system.

In still other embodiments, a shipping container as described herein may make use of both ambient air and an external supply of cooling water to accomplish cooling of the fluid in the closed loop. Ambient air could be used when the temperature of the ambient air outside the shipping container is sufficiently low to ensure the enough heat can be removed from the rack enclosures to prevent damage to the servers in the enclosures. If the ambient air temperature is too high, the cooling system could switch to an external supply of cooling water. Alternatively, if the ambient air temperature is too high, but there is no external supply of cooling water, a refrigeration system could be used to cool the fluid in the closed loop.

A description of the cooling system will now be provided in connection with FIGS. 15-26.

Figure 18:
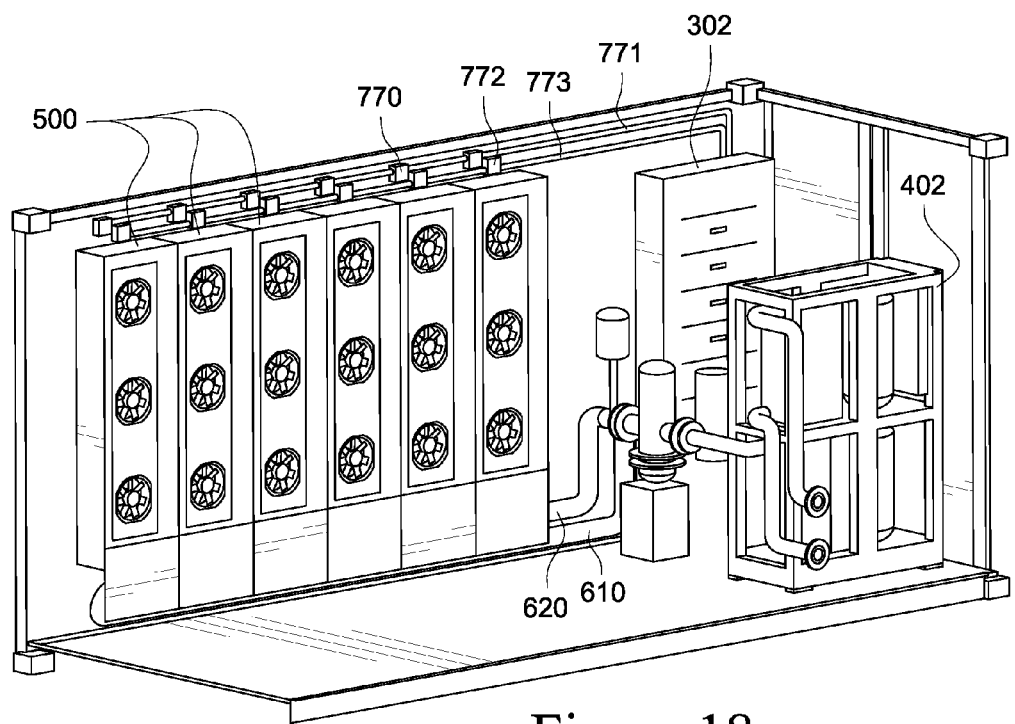
FIG. 18 is a perspective view of interior portions of a shipping container showing a plurality of enclosure cooling units mounted on a sidewall of the container.
Figure 19:
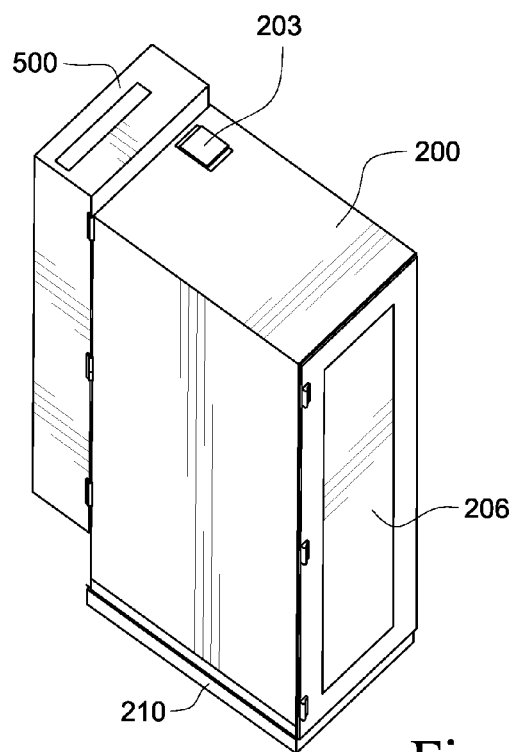
FIG. 19 is a top perspective view showing how a rack enclosure is brought adjacent to an enclosure cooling unit.

As illustrated in FIG. 18, a plurality of enclosure cooling units 500 are mounted on the sidewall of the shipping container. As described above, the rear of the rack enclosures 200 are brought adjacent the front of the enclosure cooling units 500. FIG. 19 presents a perspective view illustrating how the rear of a rack enclosure 200 is brought immediately adjacent the front of a corresponding enclosure cooling unit 500.

As also explained above, in the vast majority of rack-mounted server equipment, the servers have internal cooling fans that draw cooling air into a front face of the server enclosure, pass the air across the internal electrical components of the server, and the vent hot air out the rear of the server enclosure. The enclosure cooling units 500 are configured to receive the hot air vented from the exterior of the servers, to remove heat from the air, and to then route the cooled air back to the front of the servers.

Figure 20:
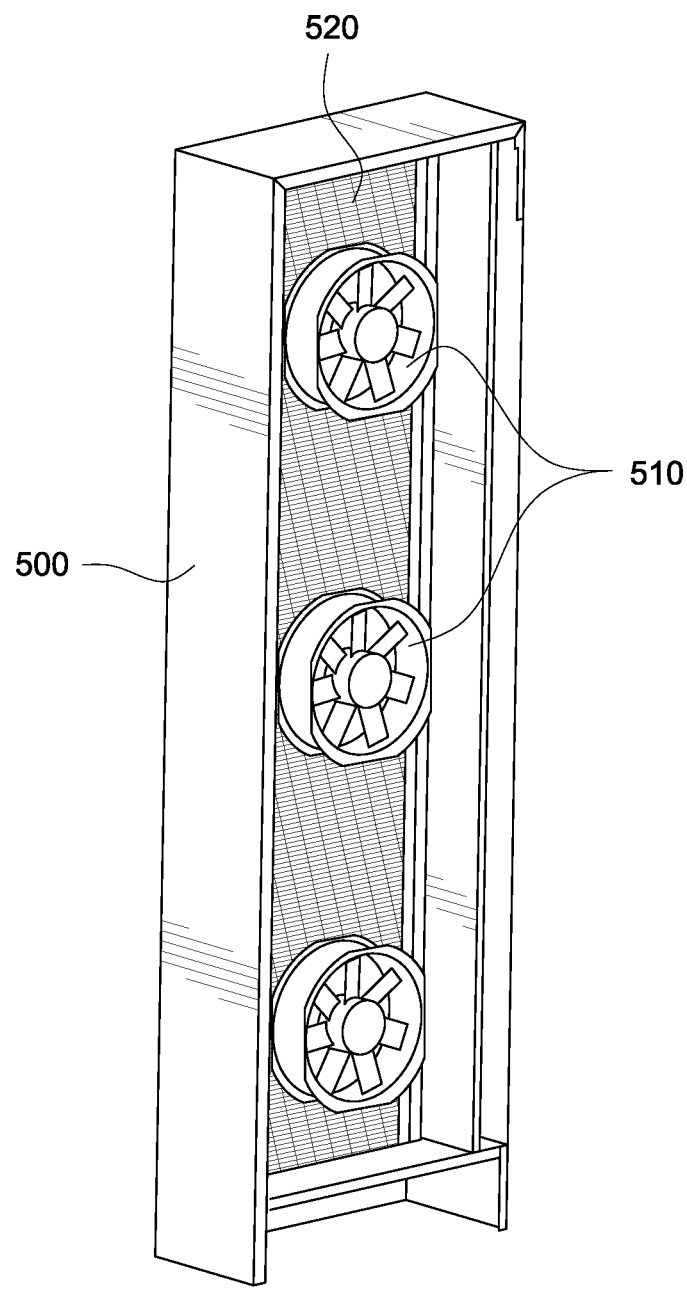
FIG. 20 is a perspective view of an enclosure cooling unit.

A detailed perspective view of an enclosure cooling unit 500 is provided in FIG. 20. As shown therein, the enclosure cooling unit 500 includes cooling fans 510 which are mounted in front of a heat exchanger or cooling coil 520. The cooling fans draw air from the rear of a rack enclosure 200 and blow the air through the heat exchanger 520.

Although the embodiment illustrated in FIG. 20 utilizes three cooling fans 510, different numbers of cooling fans could also be provided in alternate embodiments. Further, although the cooling fans 510 in this embodiment use rotary bladed fans, in alternate embodiments different types of fan units could be used. For instance, the cooling fans 510 could be scroll-type units.

Figure 21:
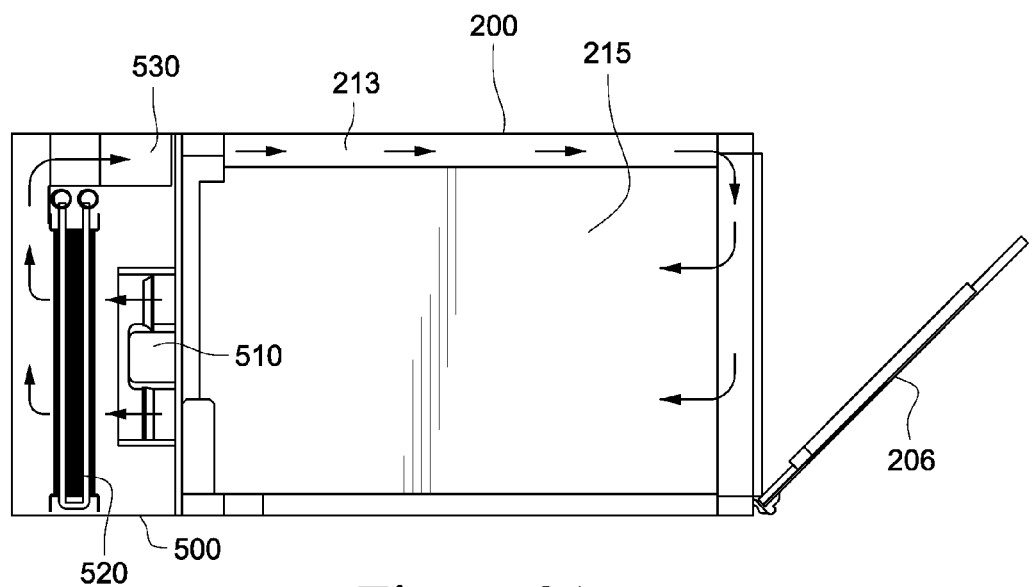
FIG. 21 is a top sectional view of a rack enclosure mounted in front of an enclosure cooling unit.

FIG. 21 is a top sectional view illustrating a rack enclosure 200 positioned in front of an enclosure cooling unit 500. As shown in FIG. 21, the rack enclosure 200 includes a server mounting area 215 and a cool air return duct 213 located along a sidewall of the rack enclosure. As also shown in FIG. 21, the cooling fans 510 are positioned to draw air out of the rear of the server mounting area 215, and to blow the air across and through the heat exchanger 520.

Figure 22:
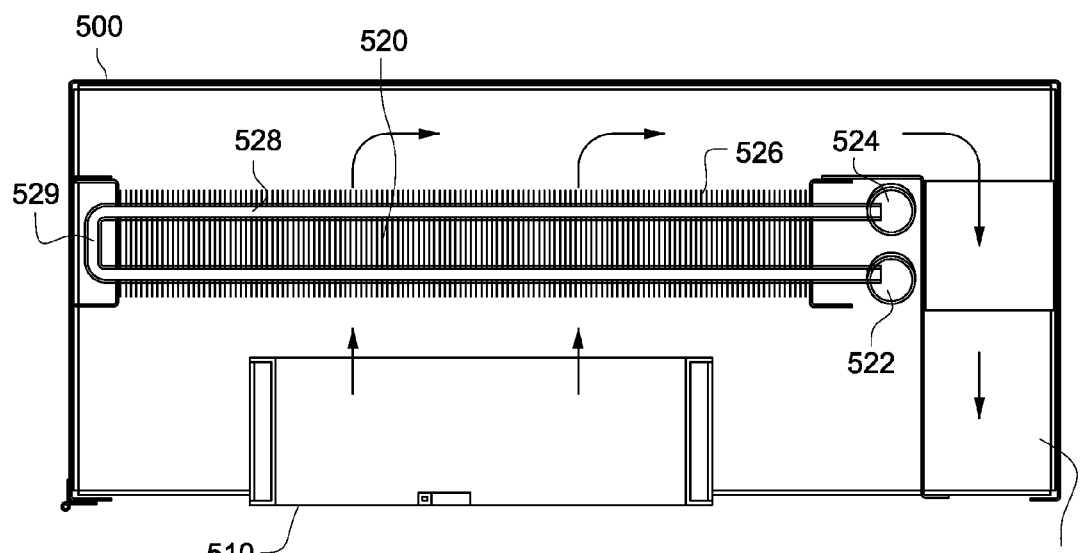
FIG. 22 is a top sectional view of an enclosure cooling unit.

FIG. 22 provides a more detailed view of the enclosure cooling unit 500. As shown in FIG. 22, cooling fans 510 are mounted in front of the heat exchanger 520. The arrows in FIG. 22 illustrate the direction of airflow through the enclosure cooling unit 500. As shown in FIG. 22, the cooling fans 510 pull air out of the rack enclosure 200 and blow the air across the heat exchanger 520. The air then moves to the right, as shown in FIG. 22, and enters an air return duct 530. Heat is removed from the air blown by the cooling fans 520 during its passage through the heat exchanger 520. As a result, the air entering the air return duct 530 has been cooled. This cool air then passes along the cool air return duct 213 of the corresponding rack enclosure, as shown by the arrows in FIG. 21, so that it is available at the front of any servers mounted in the server mounting area 215. The cooling fans within the servers in the server mounting area 215 then pull the cool air into the front of the servers, across the electrical components in the servers, and direct the warmed air out the back of the servers to a position in front of the cooling fans 510.

Because the cooling fans 510 force air to circulate within the rack enclosures, as described above, the servers may achieve a higher flow rate of air though the server enclosures than would have been possible using the fans inside the servers alone. Also, if a fan mounted inside a server were to fail, the cooling fans 510 in the enclosure cooling unit will still force air to circulate through the server enclosure, which can prevent damage from overheating that might otherwise occur.

Figure 23:
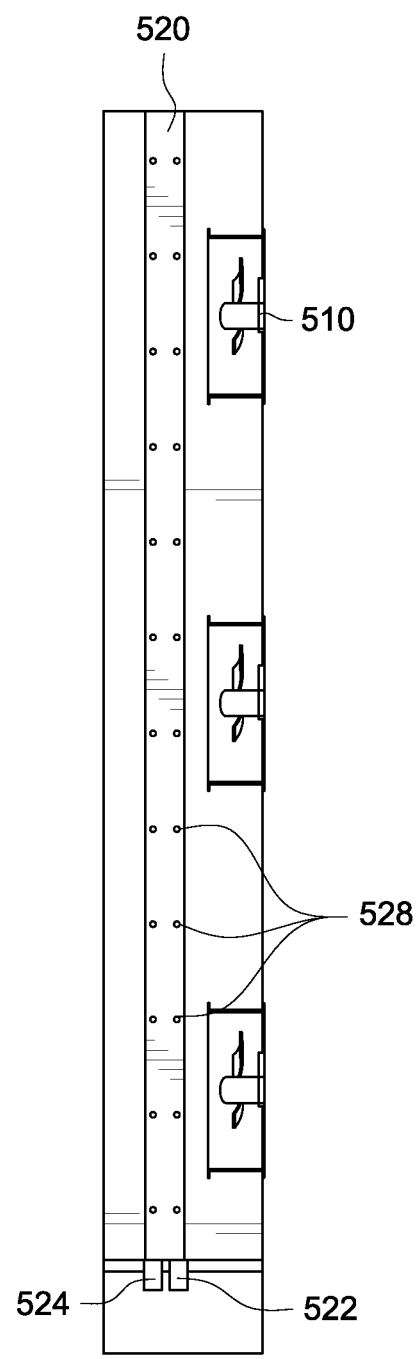
FIG. 23 is a side sectional view of an enclosure cooling unit.

FIGS. 22 and 23 illustrate details of the heat exchanger 520. As shown in FIG. 22, the heat exchanger 520 includes a plurality of cooling fins 526 mounted around a U-shaped cooling fluid line 528. A first end of the U-shaped cooling fluid line 528 is coupled to a cooling fluid supply line 524 which runs vertically up one side of the enclosure cooling unit 500. The opposite end of the U-shaped cooling fluid line 528 is coupled to a cooling fluid return line 522 which also passes vertically up the enclosure cooling unit 500. As illustrated in FIG. 23, a plurality of U-shaped cooling fluid lines 528 running through the heat exchanger 520 are attached to the cooling fluid supply line 524 and the cooling fluid return line 522 at various heights within the enclosure cooling unit 500.

Heat from the air exhausted by the servers is absorbed by the cooling fins. Cooling fluid in each of the U-shaped cooling fluid lines 528 passes around the U-shaped cooling fluid line 528 to remove the heat from the cooling fins 526. As a result, the air blown across the heat exchanger 520 is cooled as it moves from the fan side to the rear side of the enclosure cooling unit 500.

Figure 24:
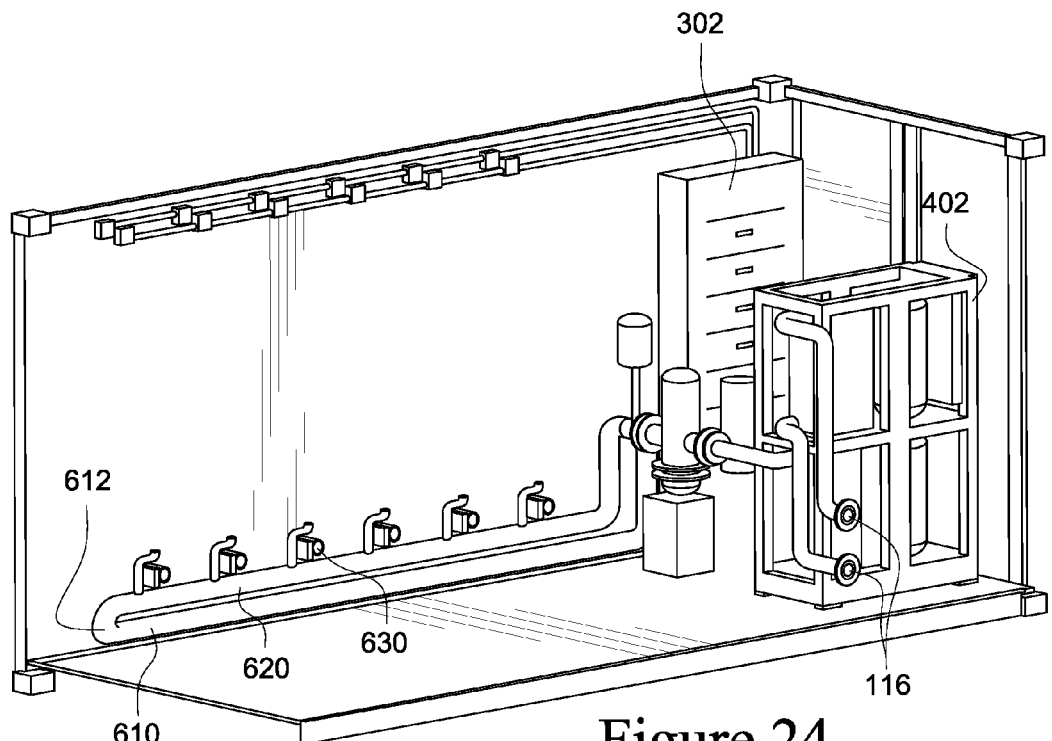
FIG. 24 is a perspective view illustrating portions of the cooling fluid piping system of a shipping container.

The cooling fluid supply line 524 in each of the enclosure cooling units 500 is provided with cooling fluid from a cooling fluid supply pipe 610, as illustrated in FIGS. 18 and 24. Once the cooling fluid has traversed the heat exchangers 520 within the enclosure cooling units 500, the cooling fluid is delivered back into a cooling fluid return pipe 620, as also illustrated in FIGS. 18 and 24. One or more enclosure cooling unit pumps 630 within each enclosure cooling unit 500 is used to draw cooling fluid out of the cooling fluid supply pipe 620, to pump the cooling fluid into the cooling fluid supply line 524, through the U-shaped cooling fluid lines 528 in the heat exchangers 520, and into the cooling fluid return line 522. The cooling fluid is then delivered from the cooling fluid return line 522 into the cooling fluid return pipe 620.

The cooling fluid supply pipe 610 and the cooling fluid return pipe 620 are operatively coupled to a cooling unit 402 located in the equipment room 120 of the shipping container. The cooling unit 402 cools the cooling fluid in the closed loop using any one of multiple different methods, as described above. In some embodiments, an evaporative heat exchanger or a refrigeration unit can be used to cool the fluid. In this instance, there would be no need to provide an external source of cooling fluid to the shipping container. In alternate embodiments, where an external source of cooling fluid or cooling water is available, the cooling unit 402 could make use of the externally supplied cooling water to cool the cooling fluid routed to the enclosure cooling units 500. In still other embodiments, the cooling unit 402 could make use of ambient air drawn from the exterior of the shipping container to cool the cooling fluid routed to each of the enclosure cooling units.

Figure 25:
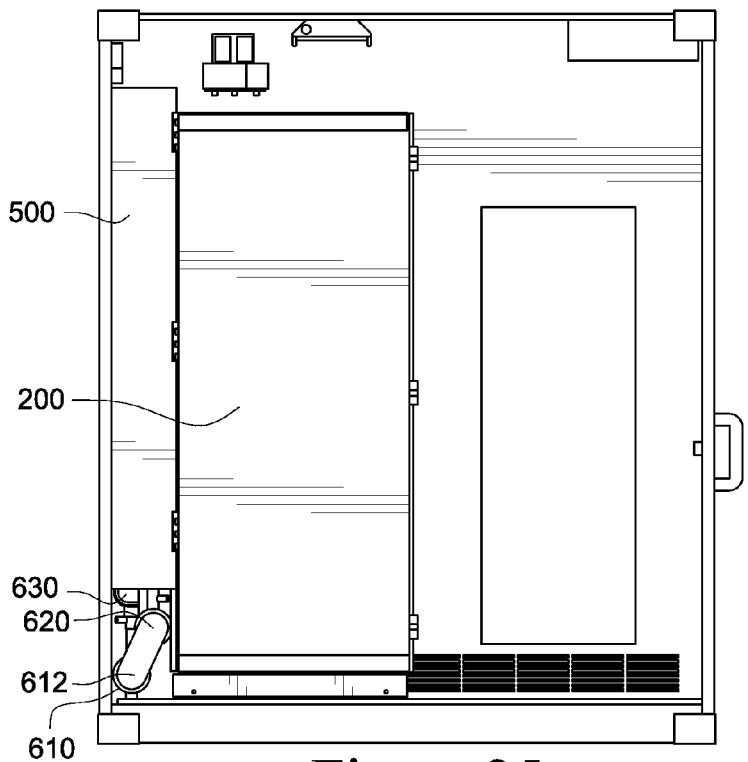
FIG. 25 is a side elevation view of the interior of a shipping container.

FIG. 25 is a side elevation view illustrating how an enclosure cooling unit 500 is coupled to the cooling fluid supply pipe 610 and the cooling fluid return pipe 620. As illustrated in FIG. 25, the cooling fluid supply pipe 610 and the cooling fluid return pipe 620 are offset from each other by a U-shaped fitting 612. An enclosure cooling unit pump 630 located between the cooling fluid supply pipe 610 and the inlet of the cooling fluid supply line 524 is used to pump cooling fluid from the cooling fluid supply pipe 610 through the interior of the enclosure cooling unit 500. The cooling fluid exiting the enclosure cooling unit 500 is routed into the cooling fluid return pipe 620.

Various different valves can be located between the cooling fluid supply pipe 610 and the enclosure cooling unit pump 630, between the enclosure cooling unit pump 630 and the cooling fluid supply line 524, and between the cooling fluid return line 522 and the cooling fluid return pipe 620. The valves could be used to control the flow of cooling fluid through the system, and also to isolate various elements for maintenance, repair and replacement.

Figure 26:
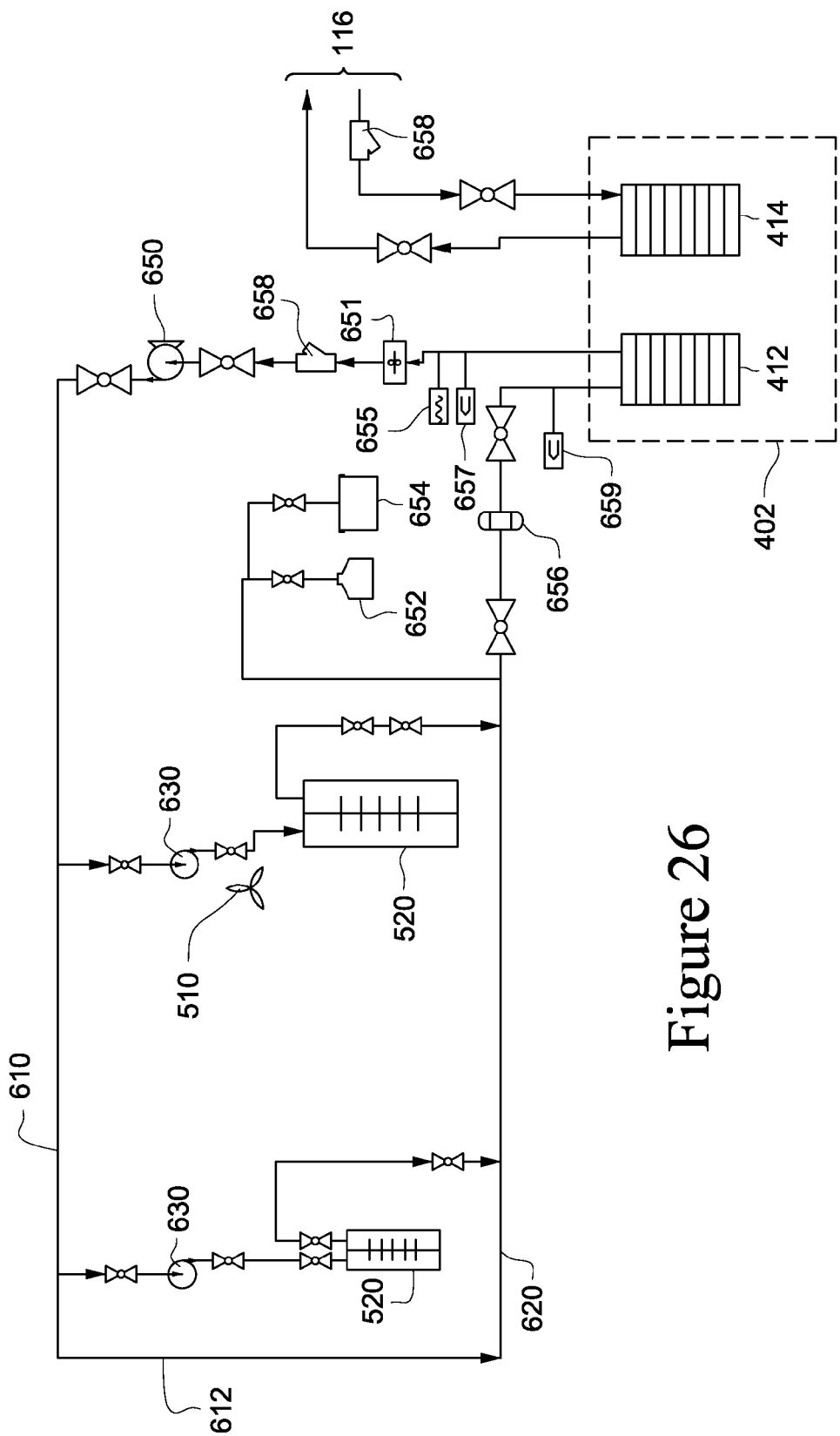
FIG. 26 is a functional diagram illustrating elements of a cooling system of a shipping container.

FIG. 26 provides a functional block diagram of the main elements of the cooling system. As shown in FIG. 26, the cooling unit 402 is coupled to the cooling fluid supply pipe 610 and the cooling fluid return pipe 620. An expansion tank 652 and a make up tank 654 may also be coupled to the cooling fluid return pipe 620 by one or more valves. The expansion tank 652 and the make up tank 654 may also be coupled to other locations within the cooling fluid circuit. A dirt and air separator 656 and a temperature sensor 659 can also be located near the end of the cooling fluid return pipe 620 coupled to the cooling unit 402.

As explained above, the cooling unit 402 could utilize an external supply of cooling water, ambient air, or a refrigeration system to cool the fluid in the closed loop that runs to each of the enclosure cooling units. In the embodiment illustrated in FIG. 26, an external supply of cooling water us utilized by the cooling unit to cool the fluid in the closed loop.

In the embodiment illustrated in FIG. 26, heat from the fluid in the closed loop is transferred from a hot side coil 412 to the externally supplied cooling water running through a cold side coil 414. The cool side coil 414 is coupled to an external supply of cooling water via an external cooling water interface 116. When available, it may be more efficient and/or economical to utilize an external source of cooling water to cool the cooling fluid routed to the enclosure cooling units.

The cooled fluid output from the cooling unit 402 is routed through a flow sensor 651 and a strainer 658 to a circulating pump 650. The circulating pump 650 circulates the cooling fluid through the cooling system. In addition, a temperature sensor 657 and a pressure sensor 655 may be coupled to the pipe leaving the cooling unit 402.

The individual enclosure cooling units include heat exchangers or cooling coils 520 which are connected between the cooling fluid supply pipe 610 and the cooling fluid return pipe 620 by appropriate valves. As also explained above, one or more enclosure cooling unit pumps 630 can be used to forcefully pump the cooling fluid through the heat exchanger 520 within each enclosure cooling unit. Fans 510 in the enclosure cooling units are used to blow air across the heat exchangers 520.

As illustrated in FIG. 26, valves can be located at various different locations to allow individual elements of the system to be isolated from the system for purposes of maintenance and repair. The valves can be manually operated or power operated. Certain valves may also be used to control the flow rate of cooling fluid through various portions of the system.

The cooling system of the shipping container described above can be controlled to minimize the consumption of electrical power, while still ensuring that the servers within the rack enclosures are provided with sufficient cooling. As explained above, many servers themselves will include internal cooling fans which are used to cool the electrical components within the servers. When a server is operating, those cooling fans will provide some degree of cooling of the electrical components.

Temperature sensors within the rack enclosures are used to sense the ambient air temperature within the rack enclosures. When the temperature inside a rack enclosure reaches a first threshold temperature, the fans 510 within the corresponding enclosure cooling unit 500 are activated to help circulate the air within the rack enclosure. As explained above, and as illustrated in FIGS. 21 and 22, the cooling fans 510 would circulate the air through the enclosure cooling unit 510, down the cool air return duct 213 of the rack enclosure and back to the front of the servers mounted in the server mounting area 215.

The rotational speed of the cooling fans 510 may be selectively varied depending on the sensed interior ambient temperature within each rack enclosure. For instance, when the temperature within a rack enclosure reaches a first threshold temperature, the fans may be activated to rotate at a relatively low speed. As the temperature within the rack enclosure increases, the rotational speed of the cooling fans 510 may be increased, to help increase the flow rate of the cooling air through the servers. By varying the rotational speed of the cooling fans 510 based on the temperature within the rack enclosures one can ensure that sufficient cooling is provided to the servers with the minimum consumption of electrical energy by the cooling fans 510.

If the temperature within a rack enclosure climbs to another higher threshold temperature, the enclosure cooling unit pump 630 within the enclosure cooling unit may be activated to begin to circulate cooling fluid through the heat exchanger 520 in the enclosure cooling unit 500. As a result, heat will be removed from the air passing through the heat exchanger 520 to provide a greater degree of cooling to the servers within the rack enclosure 200. Here again, the rotational speed of the enclosure cooling unit pump 630 may be selectively varied based upon the sensed ambient temperature within the rack enclosure. This would also serve to minimize the amount of electricity being consumed by the enclosure cooling unit pump 630.

The cooling fans 510 within each enclosure cooling unit 500 are coupled to a control system via control lines that run through a conduit 771 and fan junction boxes 770 mounted on the sidewall of the shipping container, as illustrated in FIG. 18. The enclosure cooling unit pumps 630 are coupled to a control system via control lines that run through a conduit 773 and pump junction boxes 772 mounted on the sidewall of the shipping container.

Because the cooling fans 510 and the enclosure cooling unit pump 630 within each rack enclosure are controlled only based on the sensed temperature within the rack enclosure, these elements are controlled on an enclosure-by-enclosure basis to respond to the temperature within each rack enclosure. This ensures that the minimum possible energy is consumed to provide cooling only to those rack enclosures which require it. This also allows for different operating temperatures to be maintained within the various different rack enclosures.

For example, a first rack enclosure could include servers that must be kept at a first relatively low temperature to avoid damage, whereas a second rack enclosure could include servers that can be operated at a second higher temperature without fear of damage. In such a situation, the control system could operate to maintain the first lower temperature in the first rack enclosure and the second higher temperature in the second rack enclosure. It would likely require less electrical power to keep the second rack enclosure at the second higher temperature. Thus, the overall power consumption to provide the necessary level of cooling can be minimized.

As explained in the background section above, in a traditional data warehousing facility, the ambient temperature of the entire data warehouse is typically maintained at a low enough temperature to prevent damage to the most sensitive of the equipment. Because many pieces of equipment in the data warehouse facility do not need to be kept to this relatively low temperature, the power being used to keep the less sensitive equipment at the relatively low temperature is wasted.

In contrast, when the servers are kept in individually temperature controlled rack enclosures, equipment that must be operated at relatively low temperatures can be grouped together in the same rack enclosure, and that rack enclosure can be maintained at the required low temperature. Equipment that is not sensitive to temperature can be grouped together in a different rack enclosure, and that rack enclosure can be operated at a much higher interior temperature. As a result, no power is wasted cooling equipment that is not sensitive to heat.

Because of the power savings that can be achieved through the use of the rack enclosures, it would be advantageous to mount racks of servers in rack enclosures, as described, above even when the rack enclosures are being permanently mounted in a data warehouse facility, as opposed to installing the rack enclosures in a portable shipping container. In other words, use of rack enclosures and individually temperature controlled enclosure cooling units could be employed in traditional data warehouse facility to reduce the energy consumption of the cooling systems.

There is still another benefit that can be achieved from grouping equipment that is not sensitive to high operational temperatures within the same rack enclosure. The efficiency of the heat transfer that occurs within the enclosure cooling units 500 depends, in part, on the difference between the temperature of the cooling fluid running through the heat exchanger 520 and the temperature of the air being blown across the heat exchanger 520 by the cooling fans 510. The greater the temperature difference, the more heat energy one can remove from the air, all other things being equal.

The temperature of the cooling fluid circulating through the heat exchangers 520 in the enclosure cooling units 500 will remain relatively constant. Typically, the temperature of the cooling fluid is maintained above the dew point so that no moisture condenses on the exterior of the pipes carrying the cooling fluid.

If it is possible to safely operate certain server equipment in a rack enclosure that is maintained at a relatively high ambient temperature, such as 90-100° F., a large amount of heat can be removed from the air as it passes through the heat exchanger 520 due to the large temperature difference between the cooling fluid and the air. In contrast, if it is necessary to maintain the ambient temperature within a rack enclosure at relatively low temperatures, such as 60-70° F. to avoid damaging the equipment, less heat will be removed from the air as it passes through the heat exchanger 520 due to the smaller temperature difference between the cooling fluid and the air.

For all the above reasons, it make sense to control the cooling fans 510 and pumps 630 to maintain the highest allowable temperature within each rack enclosure. Doing so will result in removing the largest amount of heat possible, given the flow rate and temperature of the cooling fluid, and the flow rate of the air caused by the cooling fans 510. And this will maximize the overall efficiency of the cooling system.

The circulating pump 650 which is used to circulate cooling fluid through the cooling unit 402, the cooling fluid supply pipe 610 and the cooling fluid return pipe 620 may only be activated once one or more of the enclosure cooling unit pumps 630 is activated. Likewise, the cooling unit 402 itself would not be activated until one of the enclosure cooling unit pumps 630 begins to circulate cooling fluid through the heat exchanger of one of the enclosure cooling units 500.

The rotational speed of the circulating pump 650, and the operating condition of the cooling unit 402 could also be selectively varied to handle different cooling demands from the enclosure cooling units 500. By only activating those components of the cooling system which are required to keep the enclosure cooling units at a desirable temperature, one can minimize the amount of electrical energy consumed by the cooling system.

As illustrated in FIGS. 13 and 14, umbilical cords 702 are used to route power lines to the interior of the rack enclosures. As mentioned above, two umbilical cords may run to each rack enclosure, one umbilical cord from each of two redundant power supply lines. The umbilical cords 702 would be long enough that the rack enclosure 200 can be pulled fully out and rotated into the position illustrated in FIG. 13 without the need to detach the umbilical cords 702 from the rack enclosure. This allows the umbilical cords 702 to remain attached to the top of the rack enclosure while maintenance and repair operations occur. The umbilical cords 702 may be configured so that any slack on the umbilical cords 702 that exists when the rack is pushed against the sidewall of the shipping container is taken up by some type of reel or tensioning mechanism. This will prevent the umbilical cords 702 from becoming tangled with other umbilical cords or with other elements located above the rack enclosures.

In some embodiments the rack enclosures 200 may not include a rear wall. As a result, the rear of the servers mounted within a rack enclosure 200 would be exposed at the rear of the rack enclosure 200. This would allow for the free flow of cooling air from the rear of the servers into the enclosure cooling units 500. In addition, this would allow maintenance personnel to easily access the rear of the servers mounted in the rack enclosure when the rack enclosure has been moved to a position as illustrated in FIG. 13.

As explained in the background section above, existing transportable shipping containers with racks of servers are typically fully populated with servers. As a result, when a business wishes to add processing capability to a data warehouse facility, an entire shipping container full of servers is added. And this can often result in the addition of more processing capability than is required.

In contrast, with a transportable shipping container as described above, the additional processing capability can be added one rack at a time. It is easy to add a new rack of servers to an existing shipping container, or to remove an unnecessary rack, using the hoist unit and overhead rail 142, in combination with the movable base units 210. Thus, one can populate a new shipping container as described above with only the number of servers currently required, knowing that additional racks of servers can easily later be added.

As also explained above, because a transportable shipping container as described above includes its own fully self contained cooling system, it is possible to install and use such a transportable shipping container in locations that do not have chilled air or an external supply of cooling water.

Moreover, because the rack enclosures can be moved into the aisle of the shipping container and rotated to provide access to the front and rear of the servers, there is no need to provide or use access panels on the exterior of the shipping container to perform maintenance and repair operations on the servers mounted in the racks. This means that maintenance and repair operations can be conducted on the servers even when the shipping container is located in a harsh environment which could damage the servers if they were exposed to the ambient environmental conditions.

In the embodiment described above, an internal wall 118 is provided to separate the equipment room 120 from the server room 130. A lockable door can be provided in that internal wall, or the internal wall might not include any door. Either way, the server room can be physically separated and secured from the equipment room. And that make it possible to provide maintenance personnel with access to the equipment room, for maintenance and repair operations, while still preventing those personnel from accessing sensitive or confidential server equipment mounted in the server room 130.

In addition, when the server equipment is mounted in rack enclosures, each rack enclosure can be separately locked. This makes it possible to co-locate the equipment from two or more different clients within a single shipping container, and still provide the clients with some level of assurance that others will not be able to access the equipment within their rack enclosures. Each client would only be capable of opening his own rack enclosures.

In the embodiment described above, the shipping container included an equipment room which included the cooling unit and certain control systems, data distribution equipment and power distribution equipment. In alternate embodiments, it would be possible to configure individual shipping containers in different ways to achieve even greater degrees of efficiency.

For instance, for larger data processing facilities, multiple shipping containers could hold only rack enclosures and enclosure cooling units. A separate shipping container could hold a much larger cooling system designed to provide cooling fluid to a large number of enclosure cooling units located in multiple different shipping containers. In such a configuration, the shipping container with the large cooling system would be connected to the enclosure cooling units in the other shipping containers, but the overall efficiencies obtained from use of the rack enclosures and the ability to individually control the temperature within each rack enclosure would be retained.

When configured as described above, it might be possible to provide sufficient cooling fluid to a larger number of enclosure cooling units in multiple shipping containers with less power than would be possible when each shipping container includes its own separate cooling unit. Also, it may be less expensive to provide a single large cooling unit in its own shipping container, as opposed to providing multiple smaller cooling units in each shipping container.

Likewise, a control system used to individually control the enclosure cooling units in multiple shipping containers might be located inside the same shipping container that holds a large cooling unit. Alternatively, the control system for multiple shipping containers full of rack enclosures and enclosure cooling units might be located in its own shipping container. Here again, the cost to provide a single large control system might be lower than the cost of providing multiple smaller control system in each shipping container.

The same economies of scale that apply to the cooling and control systems described above might also be applied to the power and data distribution systems.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A container for holding electronic equipment, comprising:
    the container having a floor, a ceiling, a front sidewall, a rear sidewall and a plurality of floor rails mounted on the floor, each floor rail extending from a position adjacent the rear sidewall toward the front sidewall;
    at least one enclosure cooling unit mounted adjacent the rear sidewall;
    at least one rack enclosure that is movably mounted in the container, wherein each rack enclosure is configured to receive rack-mountable electronic equipment, wherein each rack enclosure is individually movable along at least one of the plurality of floor rails between a mounted position where a rear of each rack enclosure abuts a front of a corresponding enclosure cooling unit of at least one enclosure cooling unit, and an intermediate position wherein the rear of each rack enclosure still faces the corresponding enclosure cooling unit, but where the rear of each rack enclosure is spaced apart from the corresponding enclosure cooling unit, and wherein each rack enclosure can swivel between the intermediate position and an access position at which a rack sidewall of each rack enclosure faces the front sidewall of the container.

2. The container of claim 1, further comprising at least one movement unit that is movably mounted on the at least one of the plurality of floor rails, wherein each movement unit is configured to receive a respective rack enclosure of the at least one rack enclosure and to move the respective rack enclosure between the mounted position and the intermediate position.

3. The container of claim 2, further comprising at least one swivel mechanism, wherein each swivel mechanism is configured to allow the respective rack enclosure to swivel with respect to a corresponding one of the at least one underlying movement unit.

4. The container of claim 1, further comprising at least one umbilical cord, wherein each umbilical cord has a first end attached to a stationary power or data junction box and a second end attached to a respective rack enclosure of the at least one rack enclosure, wherein each umbilical cord is configured to route power or data lines between the stationary power or data junction box and an interior of the respective rack enclosure, and wherein each umbilical cord has a length that allows the respective rack enclosure to which it is attached to move between the mounted, intermediate, and access positions.

5. The container of claim 1, wherein each rack enclosure comprises:
    exterior rack sidewalls, wherein one of the exterior rack sidewall is the rack sidewall;
    a front access door;
    an open rear configured to abut the corresponding enclosure cooling unit;
    a rack configured to receive the rack-mountable electronic equipment, a rear of the rack faces the rear of each rack enclosure and a front of the rack faces a front of each rack enclosure; and
    a cool air return duct that passes along at least one of the exterior rack sidewalls, wherein the cool air return duct is configured to convey a flow of cooling air from the rear of each rack enclosure to a position in the front of the rack.

6. The container of claim 1, wherein each enclosure cooling unit comprises:
    at least one cooling fan;
    a heat exchange unit that extends up a height of each enclosure cooling unit; and
    a duct that is configured to conduct a flow of cooling air from a position at a rear side of the heat exchange unit around a side of the heat exchange unit to a position at a front of each enclosure cooling unit.

7. The container of claim 6, wherein the heat exchange unit of each enclosure cooling unit comprises:
    a cooling fluid supply line that extends up a height of the heat exchange unit;
    a cooling fluid return line that extends up a height of the heat exchange unit;
    a plurality of cooling fluid lines positioned at different heights along the heat exchange unit, wherein a first end of each cooling fluid line is coupled to the cooling fluid supply line and wherein a second end of each cooling fluid line is coupled to the cooling fluid return line; and
    a plurality of cooling fins that surround each cooling fluid line.

8. The container of claim 7, wherein each enclosure cooling unit also comprises a cooling fluid pump that is coupled to the cooling fluid supply pipe and to the cooling fluid supply line of the heat exchange unit, wherein the cooling fluid pump is configured to selectively supply cooling fluid from the cooling fluid supply pipe to the cooling fluid supply line.

9. The container of claim 8, wherein each rack enclosure comprises a temperature sensor, wherein each enclosure cooling unit comprises a controller that receives a signal from the temperature sensor located in a respective rack enclosure of the at least one rack enclosure and that abuts the front of each enclosure cooling unit, and wherein the controller is configured such that when the signal from the temperature sensor indicates that a temperature in the respective rack enclosure is higher than a first threshold temperature, the controller activates the at least one cooling fan of each enclosure cooling unit.

10. The container of claim 9, wherein the controller is also configured such that when the signal from the temperature sensor indicates that a temperature in the respective rack enclosure is higher than a second threshold temperature, the controller activates the cooling fluid pump.

11. The container of claim 10, wherein each rack enclosure and corresponding enclosure cooling unit comprise a rack enclosure and enclosure cooling unit pair, and wherein the first and second threshold temperatures can be individually set for each rack enclosure and enclosure cooling unit pair.

12. The container of claim 10, wherein the controller is also configured to vary a speed of the at least one cooling fan based on the signal from the temperature sensor when the signal indicates that the temperature in the respective rack enclosure is between the first and second threshold temperatures.

13. The container of claim 10, wherein the controller is configured to cause the cooling fluid pump to vary a flow rate of the cooling fluid based on the signal from the temperature sensor.

14. The container of claim 6, wherein each rack enclosure comprises:
   exterior rack sidewalls, wherein one of the exterior rack sidewalls is the rack sidewall;
   a front access door;
   an open rear configured to abut a front of the corresponding enclosure cooling unit;
   a rack configured to receive the rack-mountable electronic equipment, a rear of the rack faces the rear of each rack enclosure and a front of the rack faces a front of each rack enclosure; and
   a cool air return duct that passes along at least one of the exterior rack sidewalls, wherein the cool air return duct is configured to convey a flow of cooling air from the rear of each rack enclosure to a position in the front of the rack.

15. The container of claim 14, wherein the duct of each enclosure cooling unit is configured to deliver the flow of the cooling air into the cool air return duct of a respective rack enclosure of the at least one rack enclosure that abuts the front of each enclosure cooling unit.

16. The container of claim 1, further comprising:
   a transport rail mounted on the ceiling of the container; and
   a hoist that is slidably mounted on the transport rail, wherein the hoist is configured to be attached to one of the at least one rack enclosure and to raise and lower the one of the at least one rack enclosure, and wherein when the hoist has been attached to and has raised the one of the at least one rack enclosure, the hoist can slide along the transport rail to move the one of the at least one rack enclosure to different locations.

17. The container of claim 16, wherein the transport rail is movably mounted on the ceiling of the container such that one end of the transport rail can extend outside the container, and such that when the hoist is holding the one of the at least one rack enclosure, the hoist can slide along the transport rail to move the one of the at least one rack enclosure from a position inside the container to a position outside the container, and vice versa.

18. The container of claim 1, further comprising a container cooling unit that is configured to supply a flow of cooling fluid to the at least one enclosure cooling unit.

19. The container of claim 1, wherein each enclosure cooling unit supplies cooling air only to a respective rack enclosure of the at least one rack enclosure that abuts the front of each enclosure cooling unit, and wherein each enclosure cooling unit is configured to maintain a temperature in the respective abutting rack enclosure below a user-selectable temperature.

20. The container of claim 1, wherein each enclosure cooling unit is configured to provide selectively varying amounts of cooling to only a respective rack enclosure of the at least one rack enclosure that abuts the front of each enclosure cooling unit such that a temperature within the respective rack enclosure can be maintained below a user-selected temperature.

* * * * *